(12) United States Patent
Lee et al.

(10) Patent No.: US 10,930,197 B2
(45) Date of Patent: Feb. 23, 2021

(54) DISPLAY APPARATUS AND TILED DISPLAY APPARATUS

(71) Applicant: Samsung Display Co., LTD., Yongin-si (KR)

(72) Inventors: Se-Ho Lee, Cheonan-si (KR); Tae-Hyung Kim, Seoul (KR); Je-Hyun Song, Seoul (KR)

(73) Assignee: Samsung Display Co., Ltd.

( * ) Notice: Subject to any disclaimer, the term of this patent is extended or adjusted under 35 U.S.C. 154(b) by 651 days.

(21) Appl. No.: 15/204,663

(22) Filed: Jul. 7, 2016

(65) Prior Publication Data

US 2017/0148374 A1  May 25, 2017

(30) Foreign Application Priority Data

Nov. 20, 2015  (KR) .................. 10-2015-0163303

(51) Int. Cl.
| | | |
|---|---|---|
| G09G 3/20 | (2006.01) | |
| G09G 3/36 | (2006.01) | |
| G09G 3/3208 | (2016.01) | |
| G09G 5/14 | (2006.01) | |
| G02F 1/1333 | (2006.01) | |
| G09G 3/3225 | (2016.01) | |
| G02F 1/1345 | (2006.01) | |

(52) U.S. Cl.
CPC ....... *G09G 3/2092* (2013.01); *G02F 1/13336* (2013.01); *G02F 1/13452* (2013.01); *G09G 3/3208* (2013.01); *G09G 3/3225* (2013.01); *G09G 3/36* (2013.01); *G09G 3/3648* (2013.01); *G09G 5/14* (2013.01); *G09G 2300/026* (2013.01); *G09G 2300/0426* (2013.01)

(58) Field of Classification Search
None
See application file for complete search history.

(56) References Cited

U.S. PATENT DOCUMENTS

| | | | | |
|---|---|---|---|---|
| 2003/0141504 A1* | 7/2003 | Kuwabara | ........... | H01L 27/1214 257/66 |
| 2008/0291357 A1* | 11/2008 | Ishizuka | ............. | G02F 1/13452 349/58 |
| 2011/0096067 A1* | 4/2011 | Guo | ..................... | G09G 3/2092 345/213 |
| 2012/0140160 A1* | 6/2012 | Han | .................... | G02F 1/13336 349/144 |

(Continued)

FOREIGN PATENT DOCUMENTS

| | | |
|---|---|---|
| KR | 10-1999-0012580 A | 2/1999 |
| KR | 10-2001-0077426 A | 8/2001 |
| KR | 10-2012-0075178 A | 7/2012 |

*Primary Examiner* — LaTanya Bibbins
(74) *Attorney, Agent, or Firm* — Innovation Counsel LLP

(57) ABSTRACT

A display apparatus includes a display panel, a display panel driver and a first connection wire. The display panel includes a substrate and a display layer disposed on a first surface of the substrate. The display panel driver applies a driving signal to the display panel. The display panel driver is disposed on a second surface opposite to the first surface of the substrate. The first connection wire is disposed at a first side surface connecting the first and second surfaces of the substrate. The first connection wire connects electrically the display panel with the display panel driver.

19 Claims, 18 Drawing Sheets

(56) References Cited

U.S. PATENT DOCUMENTS

| | | | |
|---|---|---|---|
| 2012/0257361 A1* | 10/2012 | Nishi | G02F 1/13452 361/748 |
| 2013/0038581 A1* | 2/2013 | Yagi | G02F 1/1345 345/204 |
| 2015/0136438 A1 | 5/2015 | Lumetta | |
| 2016/0351164 A1* | 12/2016 | Hsieh | G09G 5/026 |
| 2017/0090624 A1* | 3/2017 | Kwon | G06F 3/044 |

* cited by examiner

DISPLAY APPARATUS AND TILED DISPLAY APPARATUS

CROSS-REFERENCE TO RELATED APPLICATION

This application claims priority under 35 USC § 119 to Korean Patent Application No. 10-2015-0163303, filed on Nov. 20, 2015 in the Korean Intellectual Property Office (KIPO); the contents of the Korean Patent Application are herein incorporated by reference in their entirety.

BACKGROUND

1. Field

Example embodiments relate to a display apparatus, a tiled display apparatus, and a method of manufacturing a display apparatus.

2. Description of the Related Art

A display apparatus may include a display panel that includes an active region and a peripheral region adjacent to the active region. The display apparatus may further include a display panel driver for applying a driving signal to the display panel driver. In addition, the display apparatus may include a controller for applying a control signal to the display panel driver. The controller includes a printed circuit board.

The display panel driver and the controller may be disposed at the peripheral region of the display panel.

Accordingly, the peripheral region may be substantially large, such that a bezel that accommodates the peripheral region may be substantially wide. The wide bezel may be undesirable to a viewer and/or user of the display apparatus in, for example, utilization of space and/or combination (e.g., tiling) of display apparatuses.

SUMMARY

Some example embodiments may be related to a display apparatus having a narrow bezel.

Some example embodiments may be related to a tiled display apparatus that includes display apparatus having narrow bezels.

Some example embodiments may be related to a method of manufacturing a display apparatus that has a narrow bezel.

According to example embodiments, a display apparatus includes a display panel, a display panel driver, and a first connection wire. The display panel includes a substrate and a display layer disposed on a first surface of the substrate. The substrate includes a switching element and a pixel electrode electrically connected to the switching element. The display layer is provided on the pixel electrode. The display panel driver applies a driving signal to the display panel. The display panel driver is disposed on a second surface opposite to the first surface of the substrate. The first connection wire is disposed at a first side surface connecting the first and second surfaces of the substrate. The first connection wire connects electrically the display panel with the display panel driver.

In example embodiments, the display apparatus may further include a second connection wire disposed on the second surface adjacent to the first side surface of the substrate. The second connection wire may electrically connect electrically the display panel driver with the first connection wire.

In example embodiments, the display apparatus may further include a third connection wire disposed at a second side surface connecting the first and second surfaces adjacent to the first side surface of the substrate. The third connection wire may electrically connect electrically the display panel with the display panel driver.

In example embodiments, the display apparatus may further include a fourth connection wire disposed on the second surface adjacent to the second side surface of the substrate. The fourth connection wire may electrically connect the display panel driver with the third connection wire.

In example embodiments, the display panel driver may further include a data driver and a gate driver. The first connection wire may electrically connect electrically the data driver with the display panel. The third connection wire may electrically connect electrically the gate driver with the display panel.

In example embodiments, the first connection wire may include and/or may be formed of aluminum, silver, copper, or gold.

In example embodiments, a line width of the first connection wire may be within a range of about 5 μm to about 40 μm.

In example embodiments, the display apparatus may further include a controller outputting a control signal to the display panel driver. The controller may be disposed at the second surface of the substrate. The display panel driver may generate the driving signal based on the control signal. The display panel driver may electrically connect electrically the display panel with the controller.

In example embodiments, the display panel driver may further include a flexible substrate connecting the controller with the display panel and a driving chip mounted on the flexible substrate. The driving chip may generate the driving signal.

In example embodiments, the controller may include a printed circuit board.

In example embodiments, the display layer may include a liquid crystal layer or an organic light emitting layer.

In example embodiments, the display panel may include a pixel area and a transmission area. The display panel may include a transparent display panel.

According to example embodiments, a tiled display apparatus includes a plurality of display panels, a plurality of display panel drivers, and a plurality of first connection wires (i.e., a plurality of first-type connection wires). The display panels are connected to one another. Each of the display panels includes a substrate and a display layer disposed on a first surface of the substrate, the substrate including a switching element and a pixel electrode electrically connected to the switching element. The display layer is provided on the pixel electrode. The display panel drivers apply driving signals to the display panels, respectively. Each of the display panel drivers is disposed on a second surface opposite to the first surface of the substrate. The first connection wires connect electrically the display panels with the display panel drivers, respectively. Each of the first connection wires is disposed at a first side surface connecting the first and second surfaces of the substrate.

In example embodiments, the tiled display apparatus may further include a plurality of second connection wires (i.e., second-type connection wires) connecting electrically the display panel drivers with the first connection wires, respectively. Each of the second connection wires may be disposed at the second surface adjacent to the first side surface of the substrate.

In example embodiments, each of the display layers may include a liquid crystal layer or an organic light emitting layer.

In example embodiments, each of the display panels may include a pixel area and a transmission area. Each of the display panels may include a transparent display panel.

According to example embodiments, in a method of manufacturing a display apparatus, a display panel may be provided. The display panel may include a substrate and a display layer disposed on a first surface of the substrate. The substrate includes a switching element and a pixel electrode electrically connected to the switching element. The display layer is provided on the pixel electrode. A first metal powder layer is formed at a first side surface connecting the first surface with a second surface opposite to the first surface of the substrate. A laser is emitted to be incident on a portion of the first metal powder layer such that a first connection wire is formed. A display panel driver is provided to apply a driving signal to the display panel. The display panel driver is disposed on the second surface of the substrate. The display panel is electrically connected to the display panel driver through the first connection wire.

In example embodiments, in electrically connecting the display panel with the display panel driver, a second metal powder layer may be formed on the second surface adjacent to the first side surface of the substrate. A laser is emitted to be incident on a portion of the second metal powder layer such that a second connection wire is formed. The display panel may be electrically connected to the display panel driver through the first and second connection wires.

In example embodiments, each of the first and second connection wires may include and/or may be formed of aluminum, silver, copper, or gold.

In example embodiments, a wavelength of the laser may be within a range of about 200 nm to about 1200 nm.

According to a display apparatus in accordance with example embodiments, a display panel and a display panel driver may be electrically connected to each other through first and second connection wires. The first connection wire may be disposed at a side surface of the substrate of the display panel. The second connection wire may be disposed at a second surface opposite to a first surface of the substrate on which a display layer is provided.

According to embodiments, the display panel driver is connected to the second surface of the substrate, such that size of the peripheral region of the display panel may be reduced. Therefore, a bezel for accommodating the peripheral region may have a minimized width. Advantageously, the display panel may have a narrow bezel.

According to embodiments, a plurality of the display panels, each of which has a narrow bezel, are connected to one another to form a tiled display apparatus. Since the display panels have narrow bezels, gaps between displayed images may be minimized, such that satisfactory display quality may be attained.

Example embodiments may be related to a display apparatus. The display apparatus may include a substrate, a first pixel electrode, a first driver, and a first switching element. The substrate may include a first side, a second side, and a third side. The first side may be opposite the second side and may be not coplanar with either of the second side and the third side. The second side may be connected through the third side to the first side and may be not coplanar with the third side. The first switching element may be electrically connected to each of the first pixel electrode and the first driver. Both the first side and the second side may be positioned between the first driver and at least one of the first pixel electrode and the first switching element. Referring to FIG. 17, the substrate can include one or more of the elements S, 1100, 1300, 1400, and 1600. Referring to FIG. 2, FIG. 3, FIG. 4, FIG. 5, and FIG. 6, the first side, the second side, and the third side may be the side 112, the side 114, and the side 116 or 118, respectively. The first pixel electrode may be the element PE. The first driver may include at least one of the elements 410, 420, 310, 320, and 200.

The first side and the second side may be both positioned between the first driver and the first pixel electrode and may be both positioned between the first driver and the first switching element. Referring to FIG. 17, the substrate can include one or more of the elements S and 1100.

The display apparatus may include a first wire. The first wire may overlap (and direct contact) the third side and may extend not parallel to either of the first side and the second side. The first driver may be electrically connected through the first wire to the first switching element. Referring to FIG. 2, FIG. 3, FIG. 4, FIG. 5, and FIG. 6, the first wire may be a wire 500 or a wire 700.

The first wire may extend parallel to the third side. The first wire may extend perpendicular to at least one of the first side and the second side.

The display apparatus may include a second wire. The first driver may be electrically connected through the second wire to the first wire. The first side and the second side may be both positioned between the second wire and at least one of the first switching element and the first pixel electrode. Referring to FIG. 3, and FIG. 6, the second wire may be a wire 600 or a wire 800.

The first side and the second side may be both positioned between the second wire and the first switching element. The first side and the second side may be both positioned between the second wire and the first pixel electrode.

The second wire may extend perpendicular to at least one of the third side and the first wire.

The display apparatus may include a third wire. The first wire may be electrically connected through the fourth wire to the first switching element. The first side and the second side may be both positioned between the second wire and the third wire. Referring to FIG. 1, FIG. 2, FIG. 4, and FIG. 5, the third wire may be a wire FO1 or a wire FO2.

The third wire may extend perpendicular to at least one of the first wire and the third side.

The display apparatus may include a fourth wire and a second driver. The second driver may be electrically connected through the fourth wire to the first switching element. The substrate may include a fourth side. The fourth side may overlap the fourth wire and may be not coplanar with any of the first side, the second side, and the third side. The fourth side may be directly connected to the third side. The fourth side may extend perpendicular to the third side. The first side may be connected through the fourth side to the second side. Referring to FIG. 5 and FIG. 6, the fourth wire may be the wire 700 or the wire 500; the second driver may include at least one of the elements 320, 310, 420, 410, and 200; and the fourth side may be the side 118 or 116.

The fourth wire may extend parallel to the fourth side. The fourth wire may extend perpendicular to at least one of the first side and the second side.

The display apparatus may include a third wire. The first wire may be electrically connected through the third wire to the first switching element. The first side and the second side may be both positioned between the second wire and the third wire. Referring to FIG. 1, FIG. 2, FIG. 3, FIG. 4, FIG. 5, and FIG. 6, the first wire may be a wire 500 or a wire 600;

the second wire may be a wire 600 or a wire 800; the third wire may be a wire FO1 or a wire FO2.

The display apparatus may include a second wire. The first wire may be electrically connected through the second wire to the first switching element. The first side and the second side may be both positioned between the first driver and the second wire. Referring to FIG. 1, FIG. 2, FIG. 3, FIG. 4, FIG. 5, and FIG. 6, the first wire may be a wire 500 or a wire 600; the second wire may be a wire FO1 or a wire FO2.

The display apparatus may include a wire. The first driver may be electrically connected through the wire to the first switching element. The first side and the second side may be both positioned between the first driver and the wire. Referring to FIG. 1, FIG. 2, FIG. 3, FIG. 4, FIG. 5, and FIG. 6, the wire may be a wire FO1 or a wire FO2.

The display apparatus may include a first wire, a second pixel electrode, a second driver, a second switching element, and a second wire. The first wire may extend not parallel to either of the first side and the second side. The first driver may be electrically connected through the first wire to the first switching element. The second switching element may be electrically connected to each of the second pixel electrode and the second driver. Both the first side and the second side may be positioned between the second driver and at least one of the second pixel electrode and the second switching element. The second wire may extend not parallel to either of the first side and the second side. The second driver may be electrically connected through the second wire to the first switching element. The third side may be positioned between the first wire and the second wire (in a direction perpendicular to the third side). Referring to FIG. 7, FIG. 8, and FIG. 17, the substrate may include one of more of the element S of the panel 1002 and the element S of the panel 1004; the first wire may be a wire 5002; the second wire may be a wire 5004; the first side may include at least one of the side 1042 and the side 1044; the second side may include one or more (coplanar) sides that are opposite one or more of the (coplanar) sides 1042 and 1044; the third side may be the side 1062.

The substrate may include a fourth side. The fourth side may be not coplanar with any of the first side, the second side, and the third side. The first side may be connected through the fourth side to the second side. The fourth side may be opposite the third side. The fourth side may be parallel to the third side. Both the third side and the fourth side may be positioned between the first wire and the second wire (in the direction perpendicular to the third side). The third side may be positioned between the fourth side and the first wire (in the direction perpendicular to the third side). Referring to FIG. 7 and FIG. 8, the third side may be the side 1062; the fourth side may be the side 1064 or may be a side of the panel 1002/1004 positioned at the boundary between the panels 1002 and 1004.

The display apparatus may represent a tiled display apparatus. The substrate may include a first substrate member and a second substrate member. The first substrate member may include the third side and a fifth side. The second substrate member may neighbor (and may be aligned with) the first substrate member and may include the fourth side. The fifth side may be opposite the third side, may be positioned between the third side and the second substrate member, and may be positioned between the first wire and the second wire (in the direction perpendicular to the third side).

According to embodiments, bezel widths of display apparatuses may be advantageously minimized. Therefore, storage, utilization, allocation, arrangement, and/or combination involving the apparatuses may be facilitated. As an example, the display apparatuses may be disposed in relatively limited spaces and/or relatively limited areas. As another example, the display apparatuses may combined (e.g., tiled) to form a combined display device with minimized gaps between displayed image components, such that satisfactory display quality may be attained.

DETAILED DESCRIPTION

Figure 1:
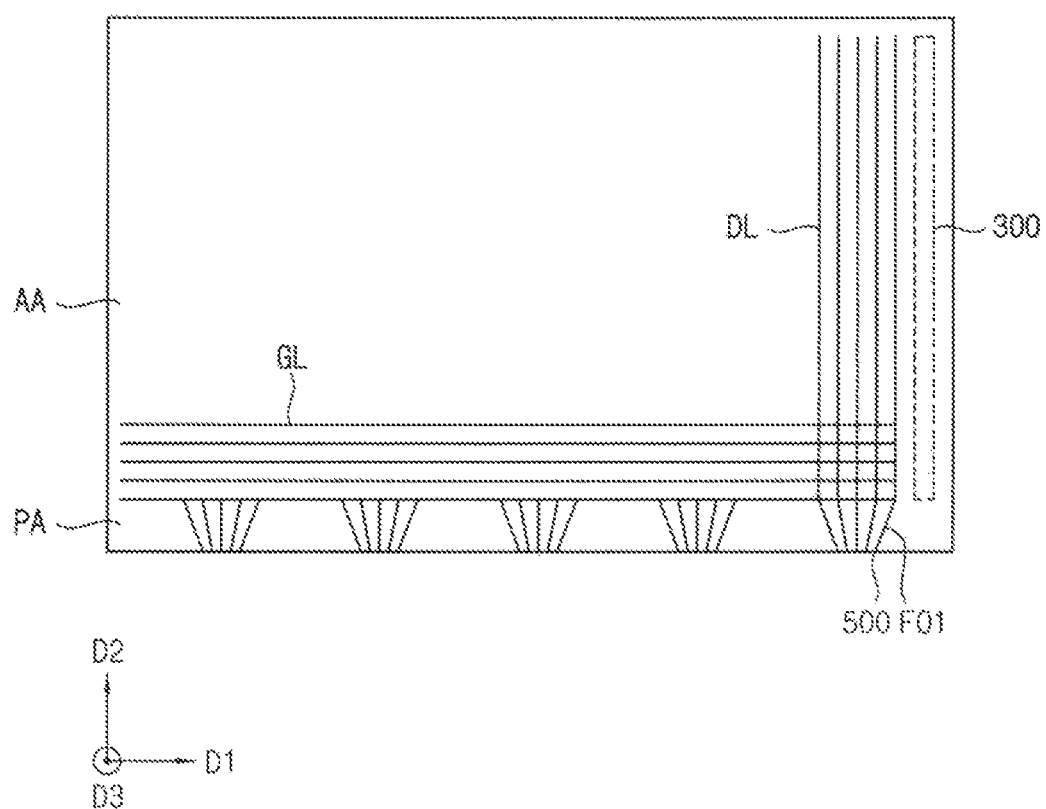
FIG. 1 is a plan view illustrating a display apparatus according to example embodiments.

Various example embodiments are described with reference to the accompanying drawings. Practical embodiments may be realized in many different forms and should not be construed as limited to the described embodiments.

Like reference numerals may refer to like elements in this application.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 2:
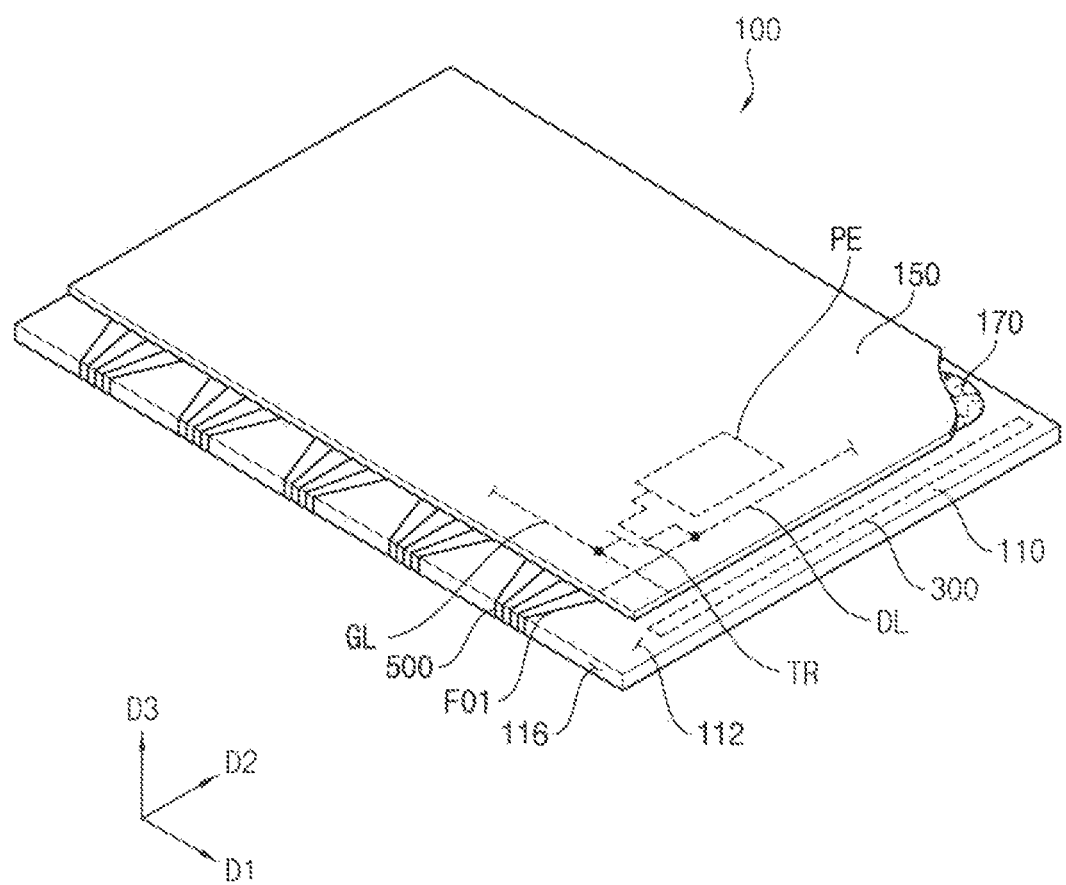
FIG. 2 and FIG. 3 are perspective views illustrating the display apparatus of FIG. 1 according to example embodiments.
Figure 3:
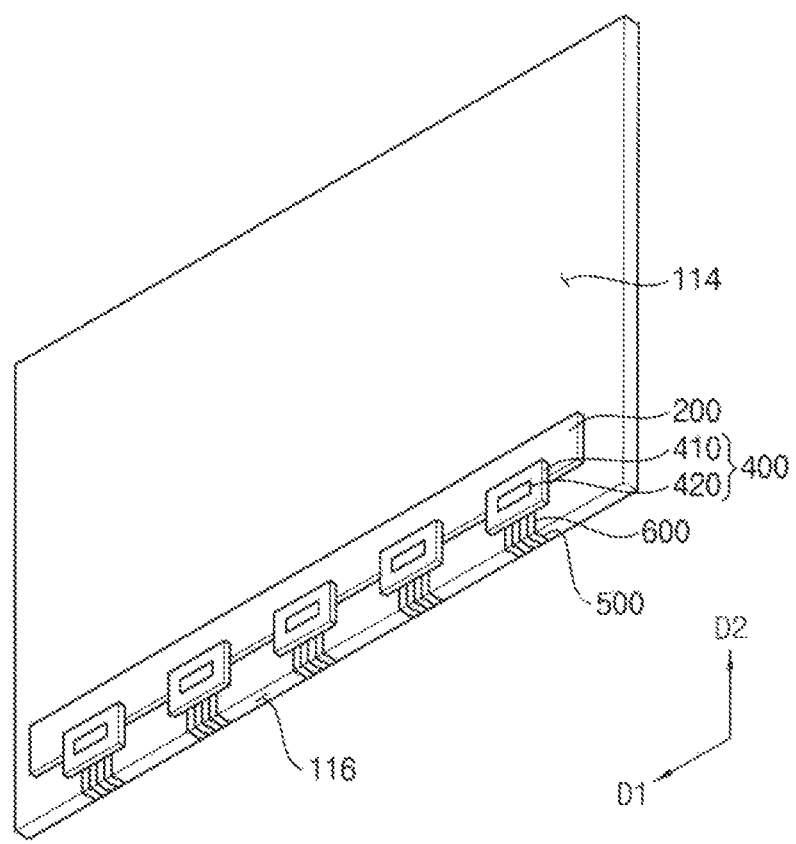

FIG. 1 is a plan view illustrating a display apparatus according to example embodiments. FIGS. 2 and 3 are perspective views illustrating the display apparatus of FIG. 1.

Referring to FIGS. 1 to 3, a display apparatus includes a display panel 100, a display panel driver and first and second connection wires 500 and 600.

The display panel 100 includes an active region AA on which an image is displayed and the peripheral region PA adjacent to the active region AA and not displaying the image. The active region AA may be called to a display region.

The display panel 100 includes a plurality of gate lines GL, each of which extends a first direction D1, and a plurality of data lines DL, each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR and a pixel electrode PE electrically connected to the switching element TR. The pixels may be disposed in a matrix form.

The display panel 100 may include a first substrate 110 and a second substrate 150 opposite to the first substrate 110.

For example, the first substrate 110 may be an array substrate. The gate lines GL and the data lines DL may be disposed on the first substrate 110. A plurality of switching elements TR connected to the gate lines GL and the data lines DL may be disposed on the first substrate 110. The pixel electrode PE may be disposed on the first substrate 110.

The second substrate 150 may be a corresponding substrate opposite to the first substrate 110. A common electrode (not shown) facing the pixel electrode PE may be disposed under the second substrate 150. A color filter defining a color of the pixel may be disposed under the second substrate 150. In embodiments, the common electrode and the color filter may be disposed on the first substrate 110.

In embodiments, the second substrate 150 may be a thin film encapsulation layer. The thin film encapsulation layer may include a plurality of organic layers and a plurality of inorganic layers. The organic layers and the inorganic layers may be stacked on one another, alternatingly.

An overlap area between the first substrate 110 and the second substrate 150 may be substantially the same as the active region AA of the display panel 100. In embodiments, the overlap area between the first substrate 110 and the second substrate 150 except for the area where the sealing member (not shown) is disposed may be defined to the active region AA of the display panel 100.

The display apparatus may further include a display layer 170 interposed between the first and second substrates 110 and 150. The display layer 170 may include an organic light emitting layer (not shown). In embodiments, the display layer 170 may include a liquid crystal layer (not shown). The display layer 170 may be provided on the pixel electrode PE. When a voltage is applied to the pixel electrode PE and the common electrode, the display layer 170 may display an image. The display layer 170 may be disposed on a first surface 112 of the first substrate 110.

The display panel driver may apply a driving signal to the display panel 100. The display panel driver may include a gate driver 300 and a data driver 400.

In example embodiments, the display apparatus may further include a controller applying a control signal to the gate driver 300 and the data driver 400. The controller may include a printed circuit board 200. The printed circuit board 200 may be disposed on a second surface 114 opposite to the first surface 112 of the first substrate 110.

For example, the printed circuit board 200 may include a driving circuit such as a timing controller, a power voltage generator, etc.

The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driver 300 based on the input control signal, and outputs the first control signal to the gate driver 300.

The timing controller generates the second control signal for controlling an operation of the data driver 400 based on the input control signal, and outputs the second control signal to the data driver 400.

The timing controller generates a data signal based on the input image data. The timing controller outputs the data signal to the data driver 400.

The gate driver 300 generates gate signals driving the gate lines GL in response to the first control signal received from the timing controller. The gate driver 300 sequentially outputs the gate signals to the gate lines GL.

In example embodiments, the gate driver 300 may be directly mounted on the peripheral region PA of the display panel 100 in an ASG (amorphous silicon gate) type. In addition, the gate driver 300 may be disposed on the first surface 112 of the first substrate 110.

The data driver 400 receives the second control signal and the data signal from the timing controller. The data driver 40 converts the data signal into data voltages having an analog type. The data driver 400 outputs the data voltages to the data lines DL. The data driver 400 may be disposed on the second surface 114 of the first substrate 110. The data driver 400 may output the data voltages to the data lines DL through a first fanout wire FO1. The first fanout wire FO1 may be disposed on the first surface 112 of the first substrate 110, and the first fanout wire FO1 may make contact with the data lines DL.

For example, the control signal may include the first and second control signals and the data signal. The driving signal may include the gate signal and the data voltage.

The data driver 400 may include a data flexible substrate 410 and a data driving chip 420 mounted on the data. The data flexible substrate 410 may connect electrically the printed circuit board 200 with the display panel 100. The data driving chip 420 may generate the driving signal.

In example embodiments, a plurality of data flexible substrates 410 may be provided. In addition, a plurality of data driving chips 420. Each of the data driving chips 420 may be mounted on a respective one of the data flexible substrates 410 in a COF (chip on film) type.

The first connection wire 500 may be disposed at a first side surface 116 connecting the first and second surfaces 112 and 114 of the first substrate 110. The first connection wire 500 may connect electrically the display panel with the data driver 400 through the first fanout wire FO1.

The first connection wire 500 may include a metal. For example, the first connection wire 500 may include and/or may be formed of aluminum (Al), silver (Ag), copper (Cu), or gold (Au). In addition, a line width of the first connection wire 500 may be within a range of about 5 μm to about 40 μm.

For example, a first end of the first connection wire 500 may make contact with the first fanout wire FO1. A second end of the first connection wire 500 may make contact with the second connection wire 600.

The second connection wire 600 may be disposed on the second surface 114 of the first substrate 110. The second connection wire 600 may connect electrically the display panel 100 with the data driver 400 through the first connection wire 500 and the first fanout wire FO1.

The second connection wire 600 may include a metal. For example, the second connection wire 600 may include and/or may be formed of aluminum (Al), silver (Ag), copper (Cu), or gold (Au). In addition, a line width of the second connection wire 600 may be within a range of about 5 μm to about 40 μm.

For example, a first end of the second connection wire 600 may make contact with the first connection wire 500. A second end of the second connection wire 600 may make contact with the data driver 400.

In particular, the control signal generated from the printed circuit board may be output to the data driver 400 disposed on the second surface 114 of the first substrate 110. The data driver 400 may generate the driving signal based on the control signal. The driving signal may be output to the data lines DL through the second connection wire 600 on the second surface 114 of the first substrate 110, the first connection wire 500 on the first side surface 116 of the first substrate 110 and the first fanout wire FO1 on the first surface 112 of the first substrate 110.

According to the display apparatus in accordance with example embodiments, the display panel driver may be connected to the second surface 114 of the first substrate 110 such that a space for attaching the display panel driver to the peripheral region PA of the display panel 100 is reduced and a size of the peripheral region PA of the display panel 100 may be reduced. The display apparatus having a narrow bezel may be implemented.

Figure 4:
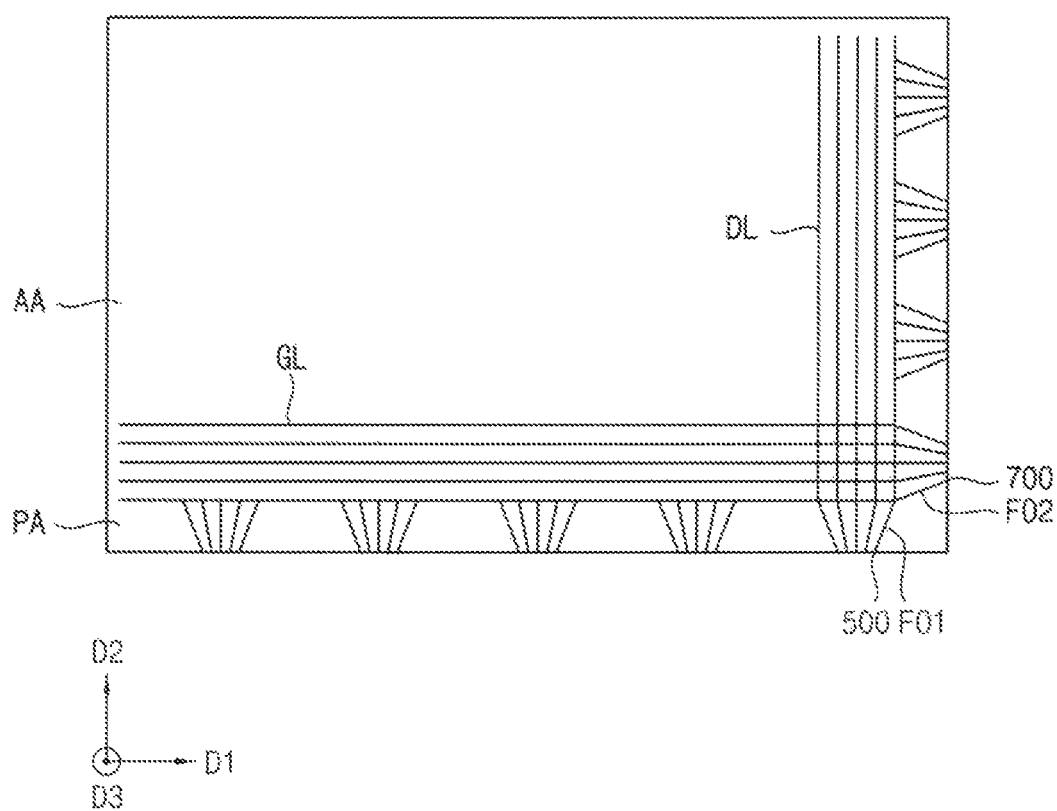
FIG. 4 is a plan view illustrating a display apparatus according to example embodiments.
Figure 5:
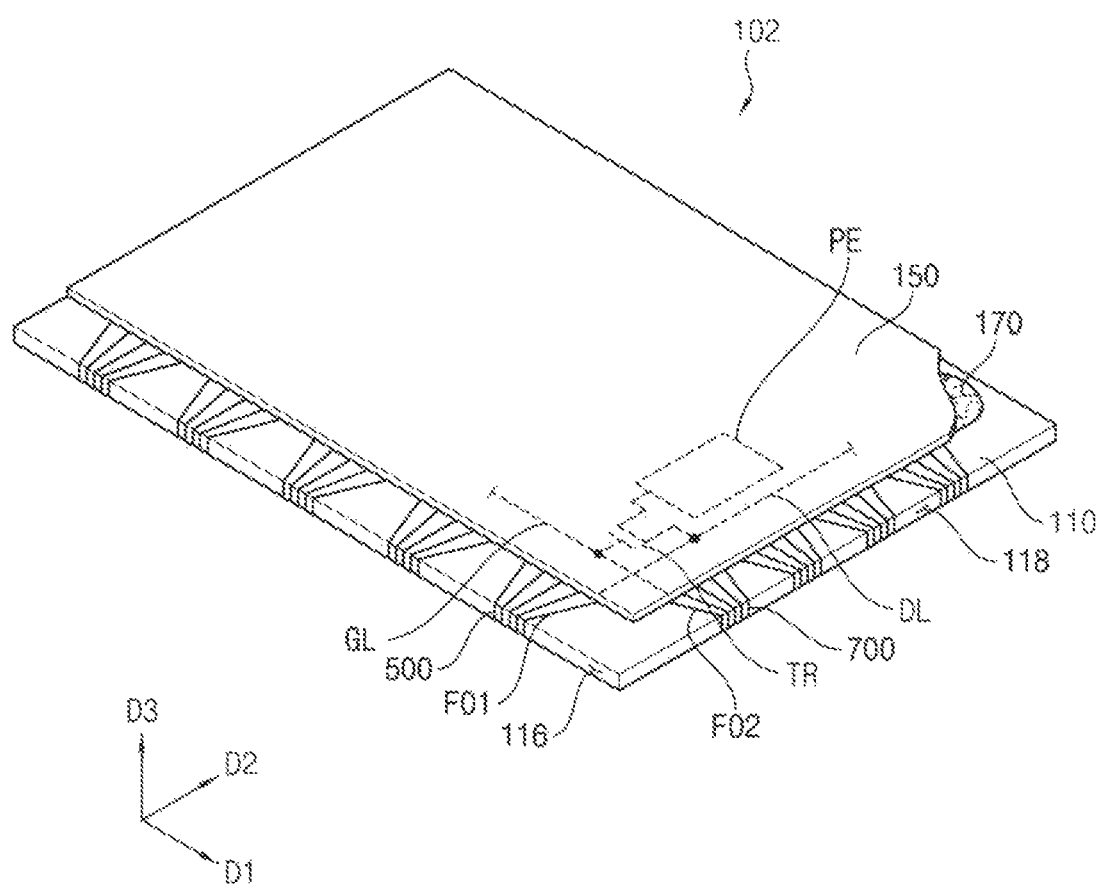
FIG. 5 and FIG. 6 are perspective views illustrating the display apparatus of FIG. 4 according to example embodiments.
Figure 6:
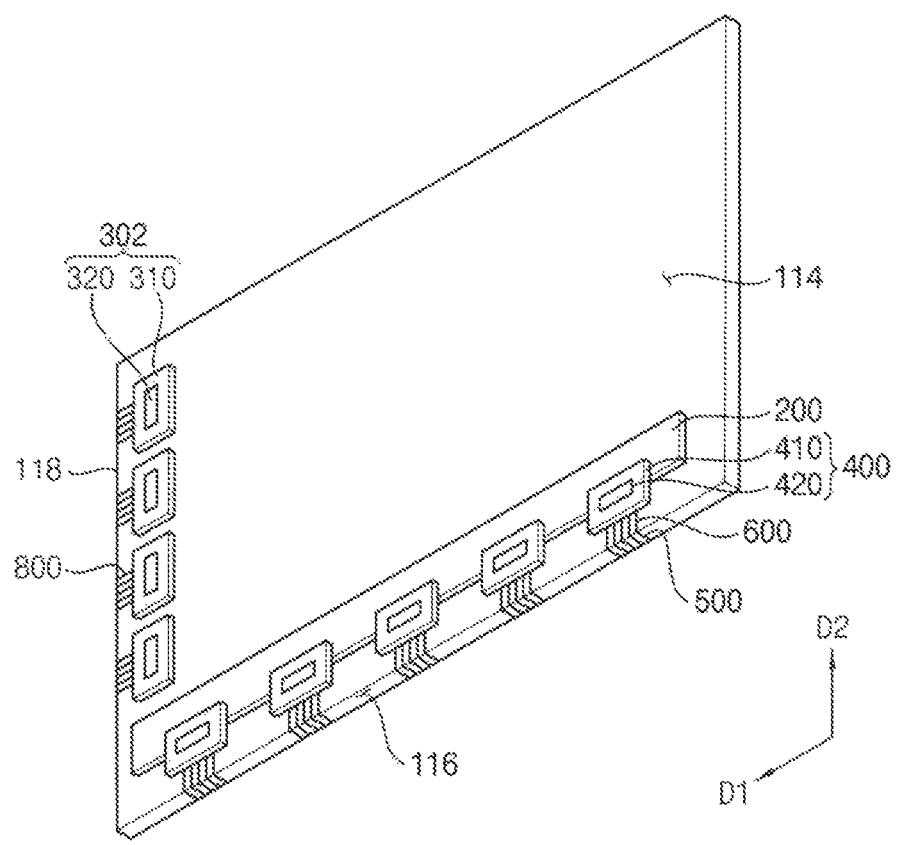

FIG. 4 is a plan view illustrating a display apparatus according to example embodiments. FIGS. 5 and 6 are perspective views illustrating the display apparatus of FIG. 4. A display apparatus of FIGS. 4 to 6 may be substantially the same as that of FIGS. 1 to 3, except for a gate driver and third and fourth connection wires. Thus like reference numerals refer to like elements, and repetitive explanations thereon may be omitted herein.

Referring to FIGS. 4 to 6, a display apparatus includes a display panel 102, a display panel driver, first and second connection wires 500 and 600 and third and fourth connection wires 700 and 800.

The display panel 102 includes an active region AA on which an image is displayed and the peripheral region PA adjacent to the active region AA and not displaying the image. The active region AA may be called to a display region.

The display panel 102 may include a first substrate 110 and a second substrate 150 opposite to the first substrate 110.

The display panel 102 may further include a display layer 170 interposed between the first and second substrates 110 and 150. The display layer 170 may include an organic light emitting layer (not shown). In embodiments, the display layer 170 may include a liquid crystal layer (not shown).

The display panel driver may apply a driving signal to the display panel 102. The display panel driver may include a gate driver 302 and a data driver 400.

In example embodiments, the display apparatus may further include a controller applying a control signal to the gate driver 302 and the data driver 400. The controller may include a printed circuit board 200. The printed circuit board 200 may be disposed on a second surface 114 opposite to a first surface 112 of the first substrate 110.

For example, the printed circuit board 200 may include a driving circuit such as a timing controller, a power voltage generator, etc.

In example embodiments, the gate driver 302 may a gate flexible substrate 310 and a gate driving chip 310 mounted on the gate flexible substrate 310. The gate flexible substrate 310 may be electrically connected to the display panel 102. The gate driving chip 310 may generate the driving signal. The gate driver 312 may be disposed on the second surface 114 of the first substrate 100.

In example embodiments, a plurality of gate flexible substrates 310 may be provided. In addition, a plurality of gate driving chips 320. Each of the gate driving chips 320 may be mounted on a respective one of the gate flexible substrates 310 in a COF (chip on film) type.

The data driver 400 may include a data flexible substrate 410 and a data driving chip 420 mounted on the data. The data flexible substrate 410 may connect electrically the printed circuit board 200 with the display panel 100. The data driving chip 420 may generate the driving signal.

In example embodiments, a plurality of data flexible substrates 410 may be provided. In addition, a plurality of data driving chips 420. Each of the data driving chips 420 may be mounted on a respective one of the data flexible substrates 410 in a COF (chip on film) type.

The first connection wire 500 may be disposed at a first side surface 116 connecting the first and second surfaces 112 and 114 of the first substrate 110. The first connection wire 500 may connect electrically the display panel with the data driver 400 through a first fanout wire FO1.

The second connection wire 600 may be disposed on the second surface 114 of the first substrate 110. The second connection wire 600 may connect electrically the display panel 100 with the data driver 400 through the first connection wire 500 and the first fanout wire FO1.

The third connection wire 700 may be disposed at a second side surface 118 connecting the first and second surfaces 112 and 114 adjacent to the first side surface 116. The third connection wire 700 may connect electrically the display panel 102 with the gate driver 302 through a second fanout wire FO2. The second fanout wire FO2 may make contact with the gate lines GL.

The third connection wire 700 may include a metal. For example, the third connection wire 700 may include and/or may be formed of aluminum (Al), silver (Ag), copper (Cu), or gold (Au). In addition, a line width of the third connection wire 700 may be within a range of about 5 μm to about 40 μm.

For example, a first end of the third connection wire 700 may make contact with the second fanout wire FO2. A second end of the third connection wire 700 may make contact with the fourth connection wire 800.

The fourth connection wire 800 may be disposed on the second surface 114 of the first substrate 110. The fourth connection wire 800 may connect electrically the display panel 102 with the gate driver 302 through the third connection wire 600 and the second fanout wire FO2.

The fourth connection wire 800 may include a metal. For example, the fourth connection wire 800 may include and/or may be formed of aluminum (Al), silver (Ag), copper (Cu), or gold (Au). In addition, a line width of the fourth connection wire 800 may be within a range of about 5 μm to about 40 μm.

For example, a first end of the fourth connection wire 800 may make contact with the third connection wire 700. A second end of the fourth connection wire 800 may make contact with the gate driver 302.

In particular, the gate driver 302 may generate the driving signal based on the control signal. The driving signal may be output to the gate lines GL through the fourth connection wire 800 on the second surface 114 of the first substrate 110, the third connection wire 700 on the second side surface 118 of the first substrate 110 and the second fanout wire FO2 on the first surface 112 of the first substrate 110.

According to the display apparatus in accordance with example embodiments, the display panel driver may be connected to the second surface 114 of the first substrate 110 such that a space for attaching the display panel driver to the peripheral region PA of the display panel 102 is reduced and a size of the peripheral region PA of the display panel 102 may be reduced. The display apparatus having a narrow bezel may be implemented.

Figure 7:
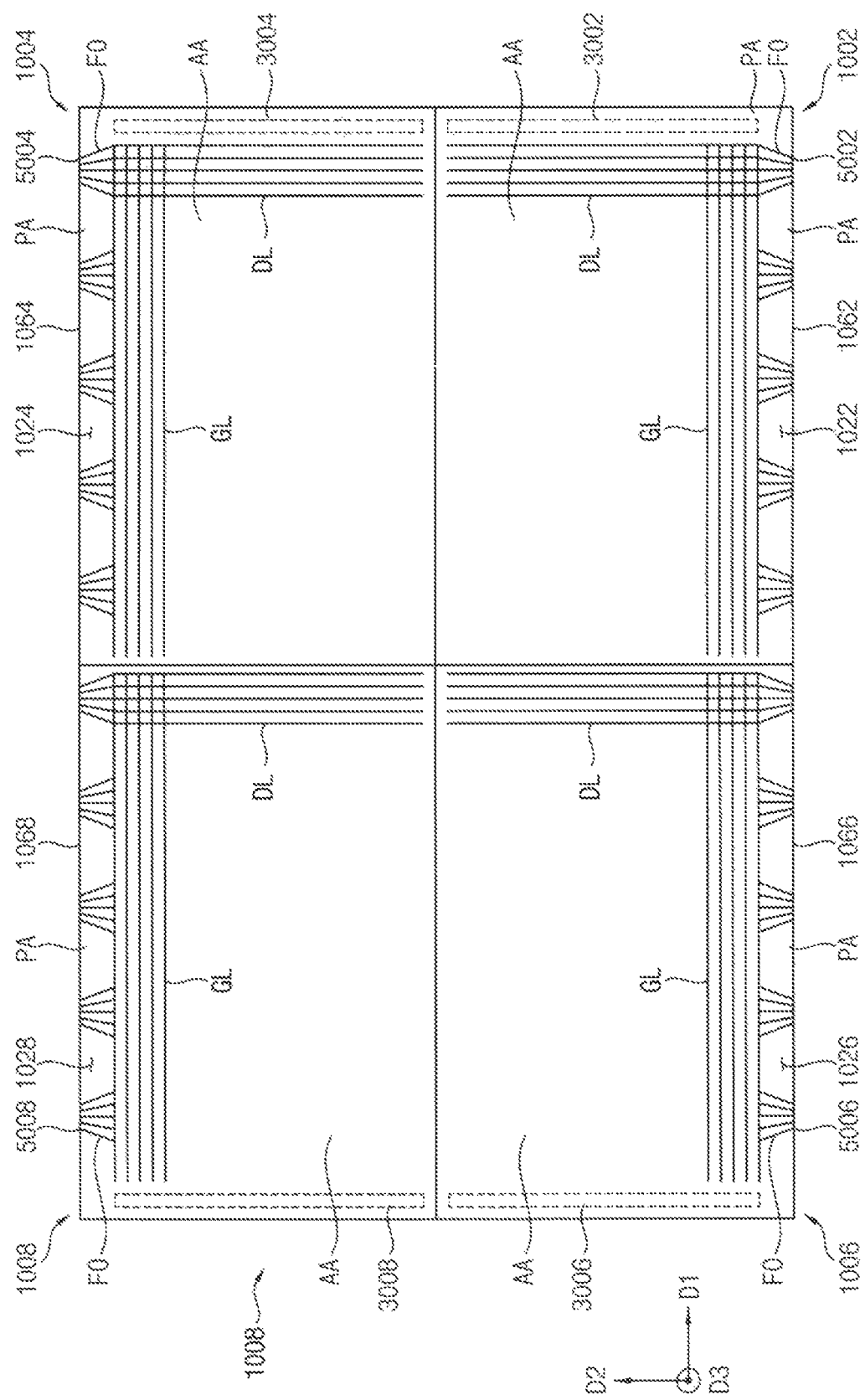
FIG. 7 is a plan view illustrating a tiled display apparatus according to example embodiments.
Figure 8:
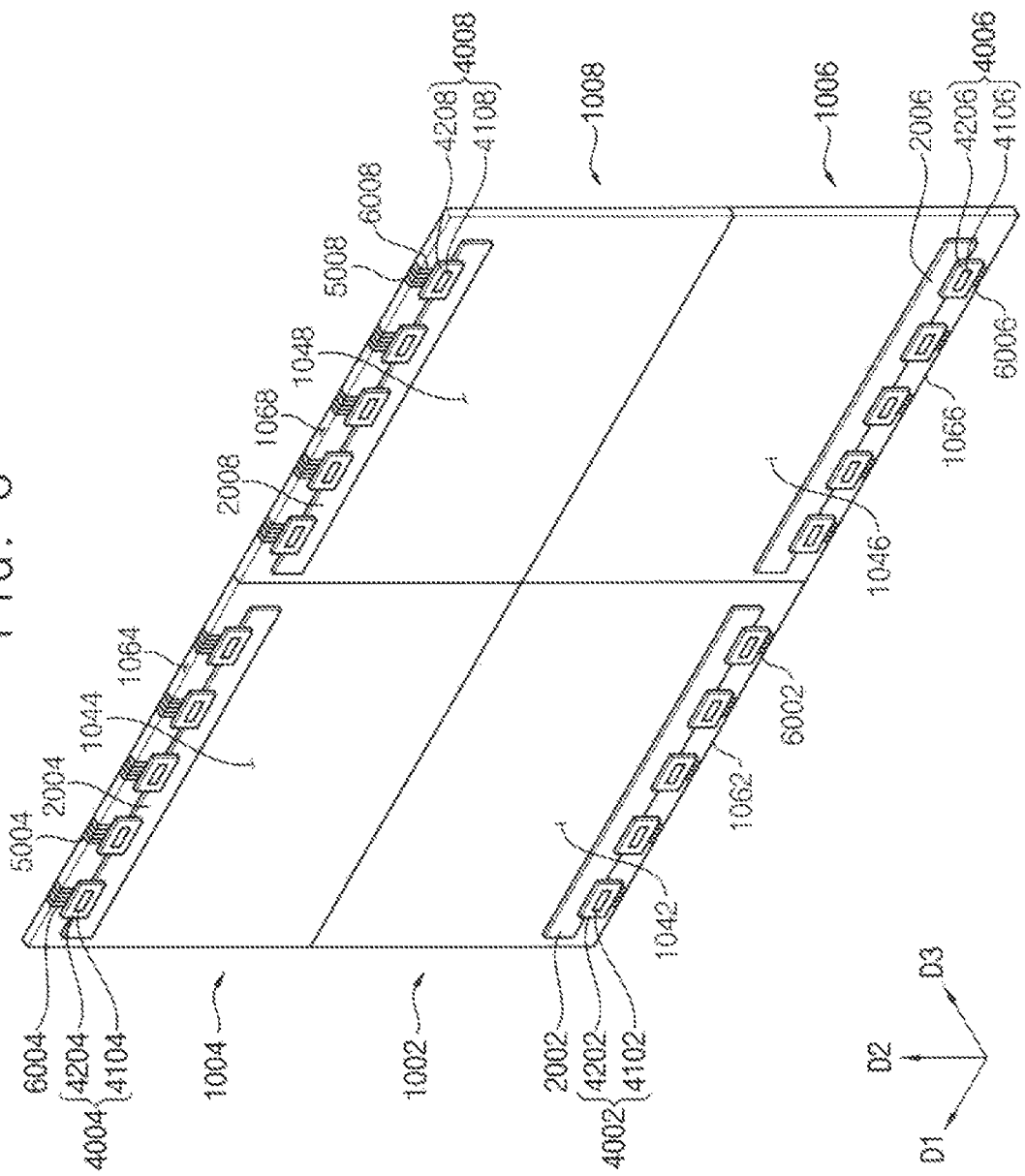
FIG. 8 is a perspective view illustrating the tiled display apparatus of FIG. 7 according to example embodiments.

FIG. 7 is a plan view illustrating a tiled display apparatus according to example embodiments. FIG. 8 is a perspective view illustrating the tiled display apparatus of FIG. 7. A tiled display apparatus of FIGS. 7 and 8 may be substantially the same as that of FIGS. 1 to 3, except for providing a plurality of display panels and a plurality of display panel drivers. Thus like reference numerals refer to like elements, and analogous explanations may not be repeated.

Referring to FIGS. 7 and 8, a tiled display apparatus includes a plurality of display panels 1002, 1004, 1006 and 1008, a plurality of display panel drivers, a plurality of first connection wires 5002, 5004, 5006 and 5008 and a plurality of second connection wires 6002, 6004, 6006 and 6006.

Each of the display panels 1002, 1004, 1006 and 1008 includes an active region AA on which an image is displayed and the peripheral region PA adjacent to the active region AA and not displaying the image. The active region AA may be called to a display region.

The display panels 1002, 1004, 1006 and 1008 may be connected to one another. For example, a first display panel 1002 may be connected to second and third display panels 1004 and 1006. The second display panel 1004 may be connected to the first display panel 1002 and a fourth display panel 1008.

For example, the first and third display panels 1002 and 1006 may be arranged in a first direction D1. The second and fourth display panels 1004 and 1008 may be arranged in the first direction D1. The first and second display panels 1002 and 1004 may be arranged in a second direction D2 crossing the first direction D1. The third and fourth display panels 1006 and 1008 may be arranged in the second direction D2.

Although four display panels 1002, 1004, 1006 and 1008 connected to one another is illustrated in FIG. 7, the present inventions should not be limited therein. For example, two or three display panels may be connected to one another in the first direction D1.

Each of the first to fourth display panels 1002, 1004, 1006 and 1008 includes a plurality of gate lines GL, each of which extends the first direction D1, and a plurality of data lines DL, each of which extends the second direction D2. Each of the first to fourth display panels 1002, 1004, 1006 and 1008 includes a plurality of pixels. The pixels are electrically connected to the gate lines GL and the data lines DL. The gate lines GL, the data lines DL and the pixels are disposed in the active region AA of each of the first to fourth display panels 1002, 1004, 1006 and 1008.

Each the display panel drivers may apply a driving signal to a respective one of the display panels 1002, 1004, 1006 and 1008. The display panel drivers may include a plurality of gate drivers 3002, 3004, 3006 and 3008 and a plurality of data drivers 4002, 4004, 4006 and 4008. For example, a first gate driver 3002 and a first data driver 4002 may provide the driving signal to the first display panel 1002. A second gate driver 3004 and a second data driver 4004 may provide the driving signal to the second display panel 1004. A third gate driver 3006 and a third data driver 4006 may provide the driving signal to the third display panel 1006. A fourth gate driver 3008 and a fourth data driver 4008 may provide the driving signal to the fourth display panel 1008.

In example embodiments, the tiled display apparatus may further include a plurality of controllers, each of which applies a control signal to a respective one of the gate drivers 3002, 3004, 3006 and 3008 and a respective one of the data drivers 4002, 4004, 4006 and 4008. For example, each of the controllers may include a respective one of printed circuit boards 2002, 2004, 2006 and 2008.

Each of the printed circuit boards 2002, 2004, 2006 and 2008 may be disposed on a respective one of second surfaces 1042, 1044, 1046 and 1048 opposite to first surfaces 1022, 1024, 1026 and 1028 of the display panels 1002, 1004, 1006 and 1008.

For example, each of the printed circuit boards 2002, 2004, 2006 and 2008 may include a driving circuit such as a timing controller, a power voltage generator, etc.

In example embodiments, each of the gate drivers 3002, 3004, 3006 and 3008 may be directly mounted on a respective one of the peripheral regions PA of the display panels 1002, 1004, 1006 and 1008 in an ASG (amorphous silicon gate) type. In addition, each of the gate drivers 3002, 3004, 3006 and 3008 may be disposed on a respective one of the first surfaces 1022, 1024, 1026 and 1028 of the display panels 1002, 1004, 1006 and 1008.

The first data driver 4002 may include a first data flexible substrate 4102 and a first data driving chip 4202 mounted on the first data flexible substrate 4102. The second data driver 4004 may include a second data flexible substrate 4104 and a second data driving chip 4024 mounted on the second data flexible substrate 4104. The third data driver 4006 may include a third data flexible substrate 4106 and a third data driving chip 4026 mounted on the third data flexible 4106. The fourth data driver 4008 may include a fourth data flexible substrate 4108 and a fourth data driving chip 4028 mounted on the fourth data flexible 4108.

Each of the first to fourth data flexible substrates 4102, 4104, 4106 and 4108 may connect electrically a respective one of the display panels 1002, 1004, 1006 and 1008 with a respective one of the printed circuit boards 2002, 2004, 2006 and 2008.

Each of the first to fourth data drivers 4002, 4004, 4006 and 4008 may be disposed on a respective one of the second surfaces 1042, 1044, 1046 and 1048 of the display panels 1002, 1004, 1006 and 1008 in a COF (chip on film) type.

Each of the first connection wires 5002, 5004, 5006 and 5008 may be disposed at a respective one of first side surfaces 1062, 1064, 1066 and 1068 connecting the first surfaces 1022, 1024, 1026 and 1028 with the second surfaces 1042, 1044, 1046 and 1048 of the display panels 1002, 1004, 1006 and 1008. Each of the first connection wires 5002, 5004, 5006 and 5008 may connect electrically a respective one of the display panels 1002, 1004, 1006 and 1008 with a respective one of the data drivers 4002, 4004, 4006 and 4008 through a respective one of fanout wires FO.

Each of the second connection wires 6002, 6004, 6006 and 6008 may be disposed on a respective one of the second surfaces 1042, 1044, 1046 and 1048 of the display panels 1002, 1004, 1006 and 1008. Each of the second connection wires 6002, 6004, 6006 and 6008 may connect electrically a respective one of the display panels 1002, 1004, 1006 and 1008 with a respective one of the data drivers 4002, 4004,

4006 and 4008 through the first connection wires 5002, 5004, 5006 and 5008 and the fanout wires FO.

According to the tiled display apparatus in accordance with example embodiments, each of the display panel drivers may be connected to a respective one of the second surfaces 1042, 1044, 1046 and 1048 of the display panels 1002, 1004, 1006 and 10008 such that a space for attaching the display panel drivers to the peripheral regions PA of the display panels 1002, 1004, 1006 and 1008 is reduced and a size of the peripheral region PA of the display panel 100 may be reduced. The tiled display apparatus having a narrow bezel may be implemented.

In particular, an area connected between the display panels 1002, 1004, 1006 and 1008 which is not displayed an image is reduced such that a large image may be displayed on the tiled display apparatus enhancing a display quality.

FIGS. 9 to 14 are perspective views illustrating a method of manufacturing a display apparatus according to example embodiments. For example, the FIGS. 9 to 14 may illustrate a method of manufacturing the display apparatus illustrated in FIGS. 1 to 3.

Figure 9:
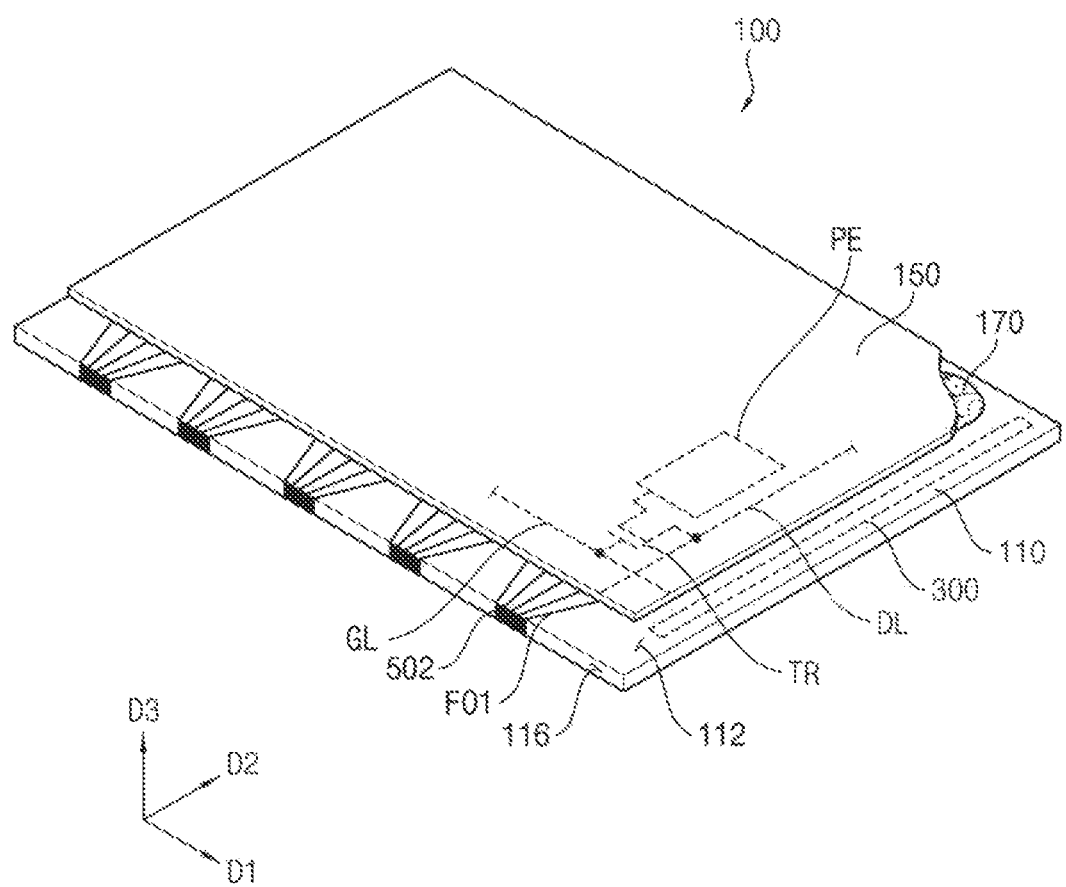
FIG. 9, FIG. 10, FIG. 11, FIG. 12, FIG. 13, and FIG. 14 are perspective views illustrating a method of manufacturing a display apparatus according to example embodiments.

Referring to FIG. 9, a display panel 100 is provided. The display panel may include a first substrate 110 including a switching element TR and a pixel electrode PE electrically connected to the switching element TR, a display layer 170 provided on the pixel electrode PE and disposed on a first surface 112 of the first substrate 110 and a second substrate 150 facing the first substrate 110 with respect to the display layer 170.

In addition, a first metal powder layer 502 may be formed on a first side surface 106 connecting the first surface 112 and a second surface 114 opposite to the first surface 112 of the first substrate 110. The first metal powder layer 502 may be formed to make contact with a first fanout wire FO1 which is electrically connected to data lines DL.

For example, the first metal powder layer 502 may be formed at the first side surface 116 of the first substrate 110 by a nozzle printing process, an inkjet printing process or a roll printing process.

In addition, the first metal powder layer 502 may be formed to include aluminum (Al), silver (Ag), copper (Cu) or gold (Au).

Figure 10:
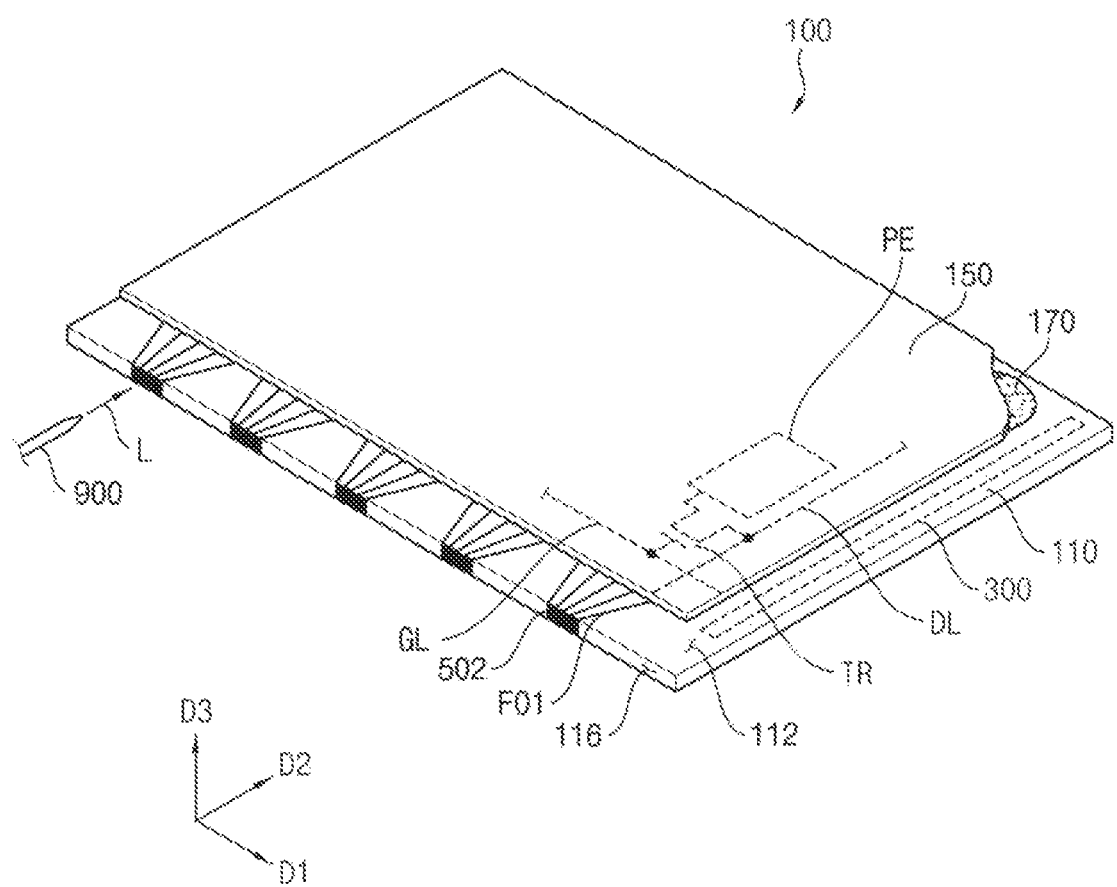
Figure 11:
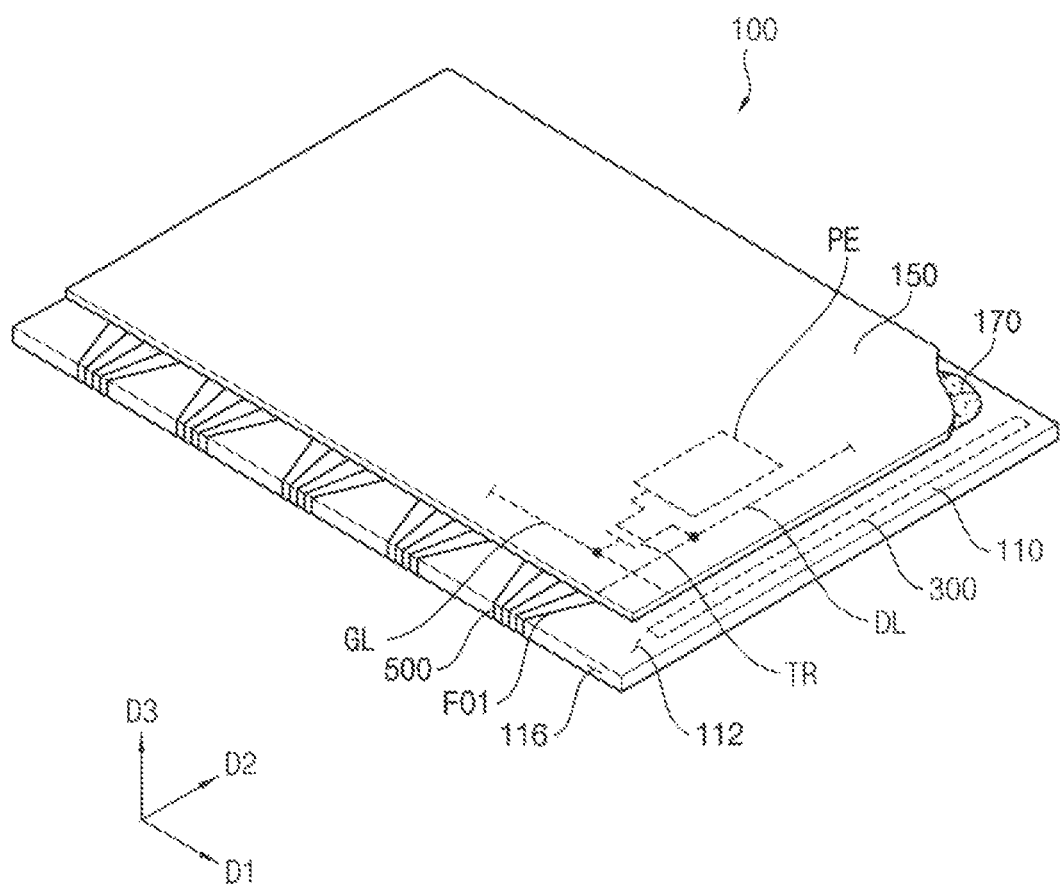

Referring to FIGS. 10 and 11, a laser L is incident on a portion of the first metal powder layer 502 to form a first connection wire 500.

For example, the laser L emitted by a laser source 900 may be incident on the portion of the first metal powder layer 502 when the laser source 900 moves along a third direction D3 crossing first and second directions D1 and D2 corresponding to the first connection wire 500 to transform the first metal powder layer 502 into the first connection wire 500.

In particular, the portion of the first metal powder layer 502 may be transformed into the first connection wire 500 through a heat of the laser L and a solidification. A remaining portion of the first metal powder layer 502 may be removed by an air washer. The first connection wire 500 may be formed to make contact with the first fanout wire FO1.

In example embodiments, a wavelength of the laser L may be within a range of about 200 nm to about 1200 nm. In addition, a line width of the first connection wire 500 may be within a range of about 5 μm to about 40 μm.

Figure 12:
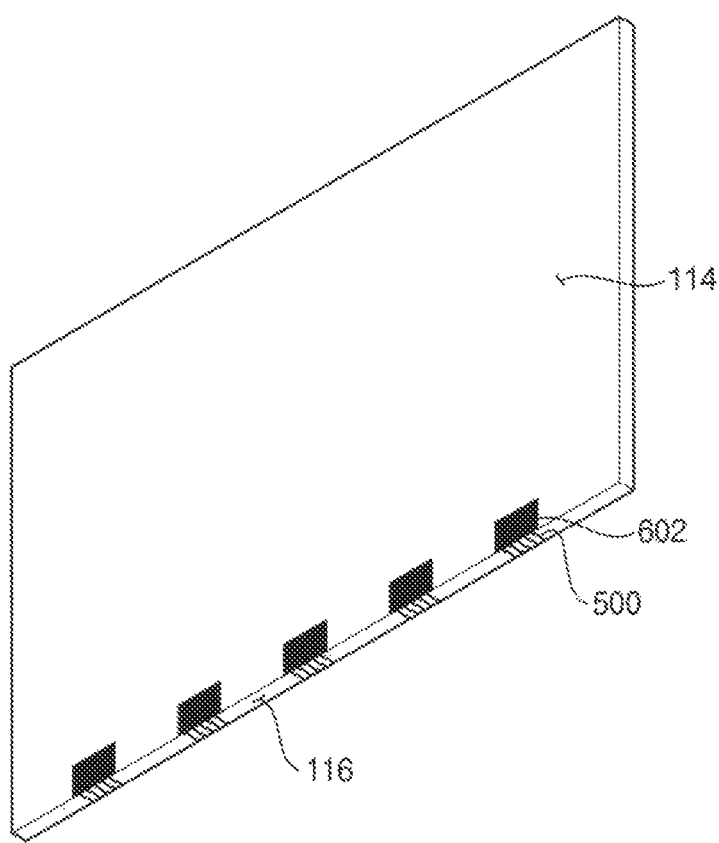

Referring to FIG. 12, a second metal powder layer 602 may be formed on the second surface 114 opposite to the first surface 112 of the first substrate 110. The first second powder layer 602 may be formed to make contact with a first connection wire 500.

For example, the second metal powder layer 602 may be formed at the second surface 114 of the first substrate 110 by a nozzle printing process, an inkjet printing process or a roll printing process.

In addition, the second metal powder layer 602 may be formed to include aluminum (Al), silver (Ag), copper (Cu) or gold (Au).

Figure 13:
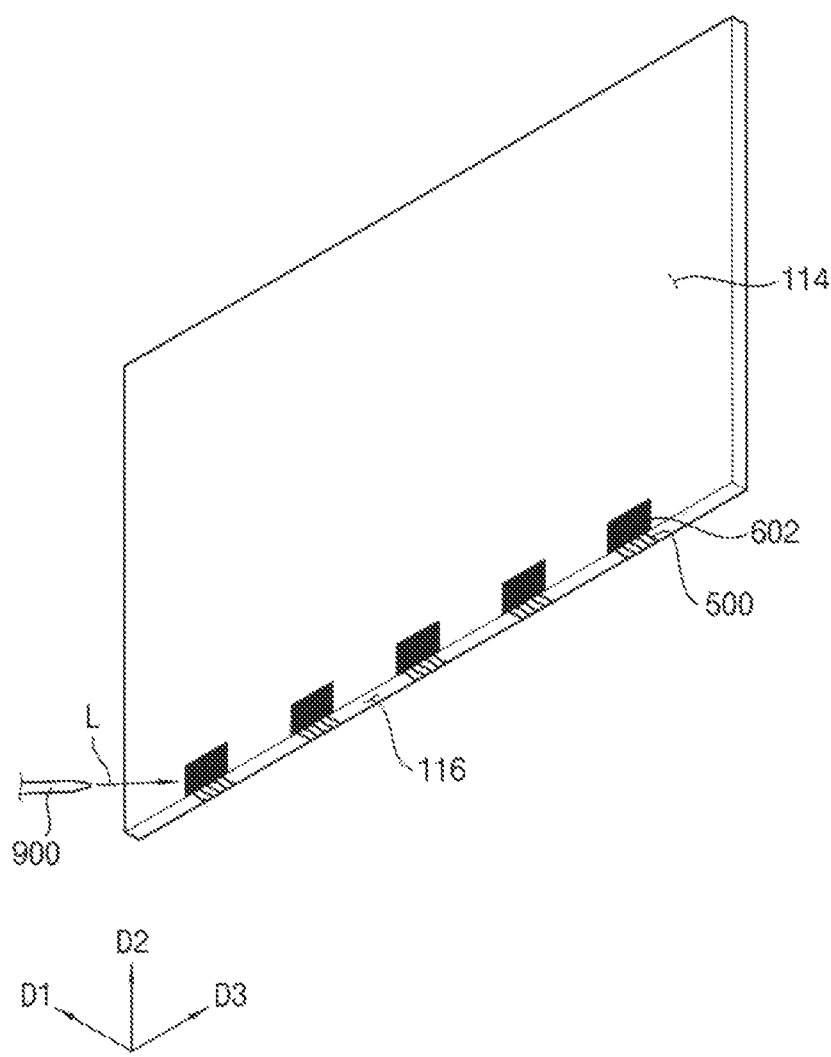
Figure 14:
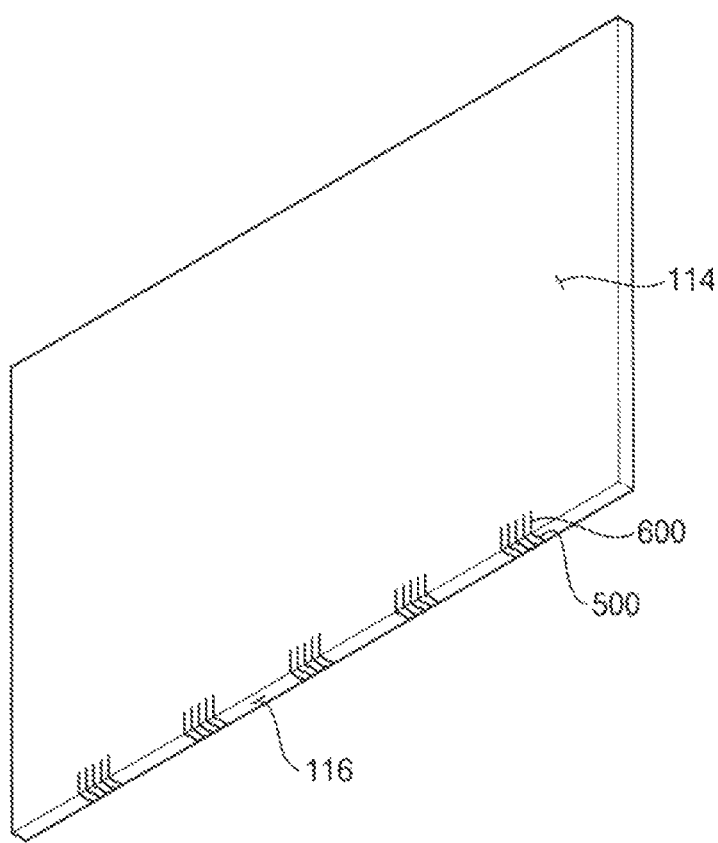

Referring to FIGS. 13 and 14, the laser L is incident on a portion of the second metal powder layer 602 to form a second connection wire 600.

For example, the laser L emitted by the laser source 900 may be incident on the portion of the second metal powder layer 602 along the second direction D2 corresponding to the second connection wire 600 to transform the second metal powder layer 602 into the second connection wire 600.

In particular, the portion of the second metal powder layer 602 may be transformed into the second connection wire 600 through a heat of the laser L and solidification. A remaining portion of the second metal powder layer 602 may be removed by an air washer. The second connection wire 600 may be formed to make contact with the first connection wire 500.

In example embodiments, a wavelength of the laser L may be within a range of about 200 nm to about 1200 nm. In addition, a line width of the second connection wire 600 may be within a range of about 5 μm to about 40 μm.

Referring to FIG. 3 again, a printed circuit board 200 and a data driver 400 may be disposed on the second surface 114 of the first surface 110. The printed circuit board 200 and the data driver 400 may be electrically connected to the second connection wire 600.

In particular, a data flexible substrate 410 of the data driver 400 may be electrically connected to the second connection wire 600 by a thermal compression process using an ACF (Anisotropic conductive film).

In addition, the printed circuit board 200 and the data flexible substrate 410 may be electrically connected to each other by the thermal compression process.

Figure 15:
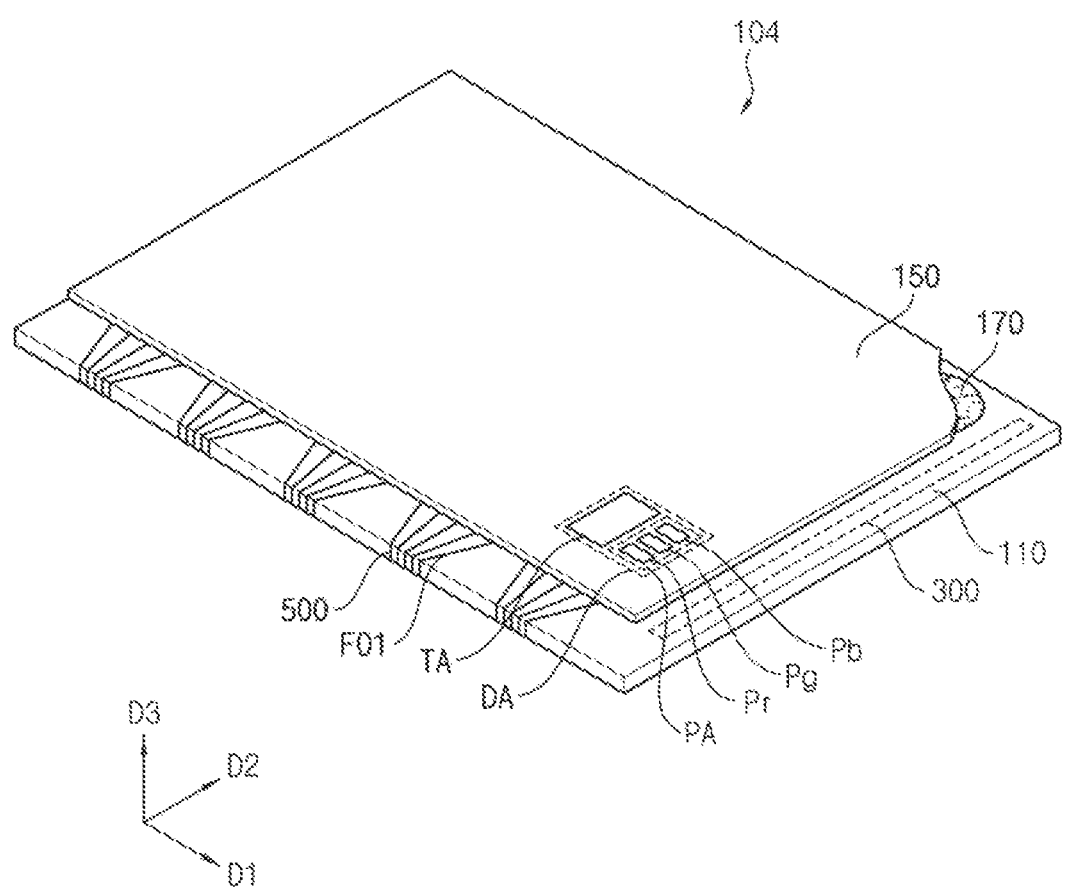
FIG. 15 is a perspective view illustrating a display apparatus according to example embodiments.
Figure 16:
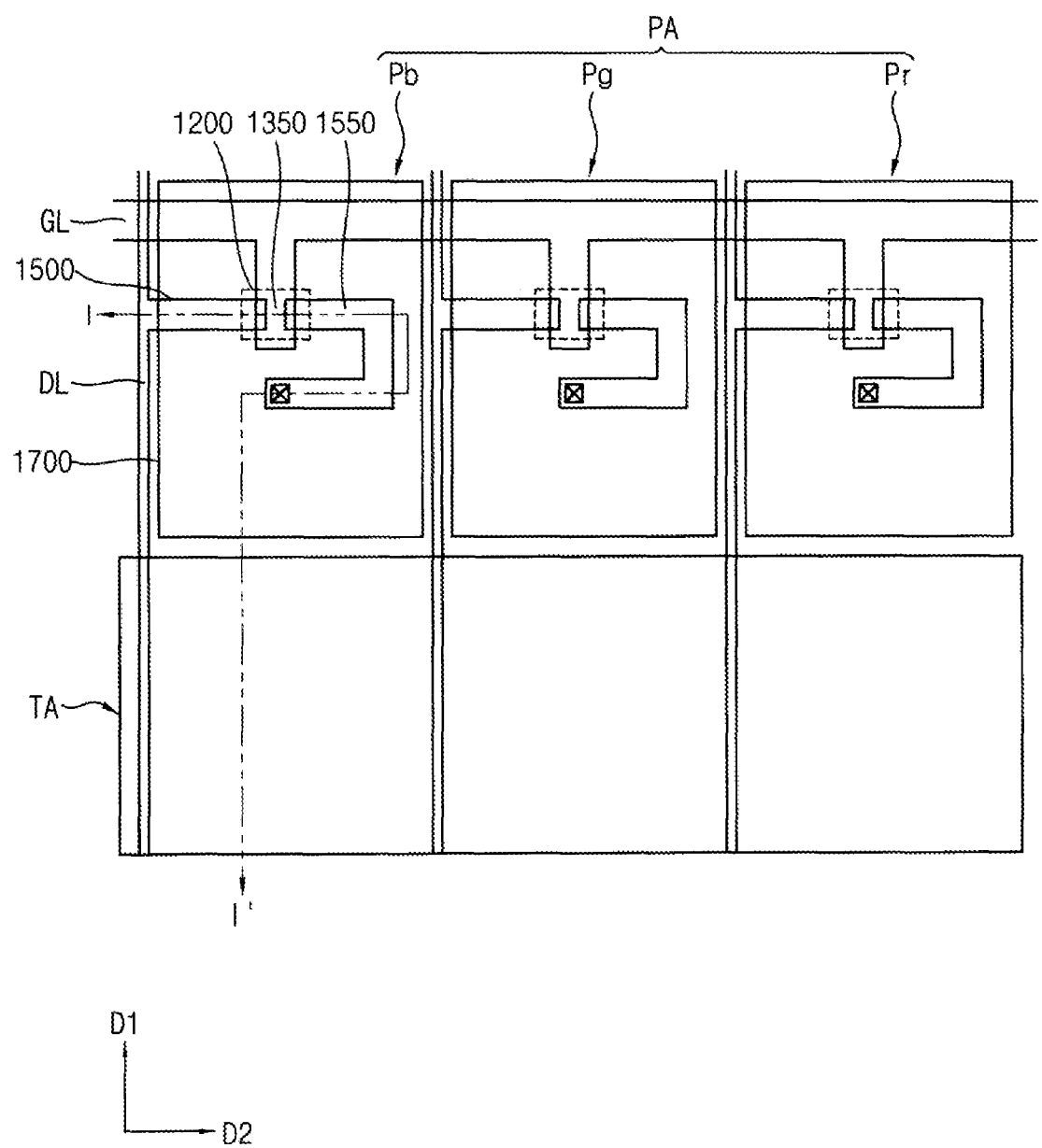
FIG. 16 is a plan view of a portion of an active region of FIG. 15 according to example embodiments.
Figure 17:
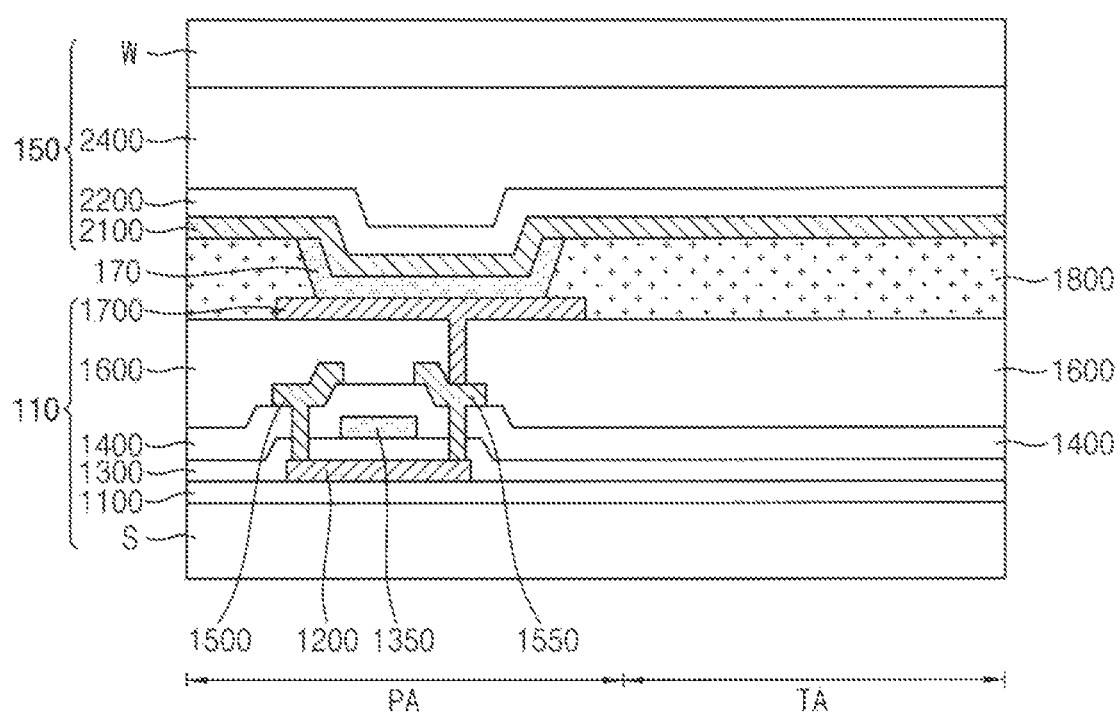
FIG. 17 is a cross-sectional view taken along the line I-I' of FIG. 16 according to example embodiments.
Figure 18:
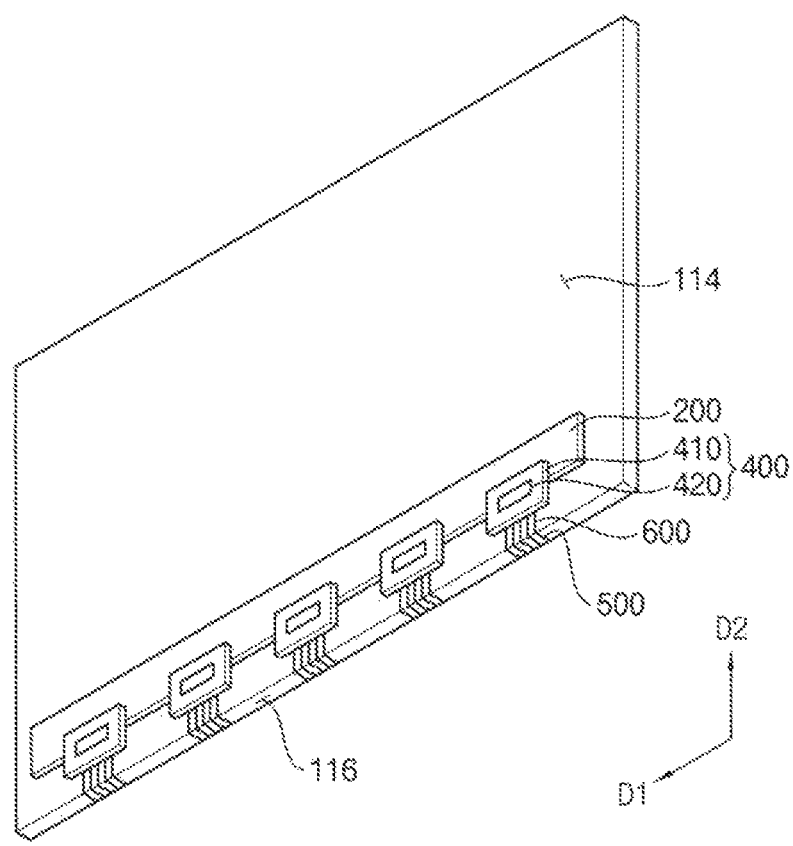
FIG. 18 is a perspective view illustrating the display apparatus of FIG. 15 according to example embodiments.

FIG. 15 is a perspective view illustrating a display apparatus according to example embodiments. FIG. 16 is an enlarged view of a portion of an active region of FIG. 15. FIG. 17 is a cross-sectional view cut along the line I-I' of FIG. 16. FIG. 18 is a perspective view illustrating the display apparatus of FIG. 15. A display apparatus of FIGS. 15 to 18 may be substantially the same as that of FIGS. 1 to 3, except that a display panel includes a transparent display panel. Thus like reference numerals refer to like elements, and repetitive explanations thereon may be omitted herein.

Referring to FIGS. 15 to 18, a display apparatus may include a transparent display panel 104, a display panel driver and first and second connection wires 500 and 600.

The transparent display panel 104 may include a first substrate 110, a second substrate 150 facing the first substrate 110 and a display layer 170 interposed between the first and second substrates 110 and 150. The first substrate 110 may include a substrate S, a pixel circuit and insulation layers formed on the substrate S and a first electrode 1700. The second substrate 150 may include an encapsulation substrate W and a filling layer 2400 disposed under the encapsulation substrate W.

The transparent display panel 104 may include a plurality of the display areas DA. The display areas DA may be arranged along a first direction D1 and a second direction D2 which may be parallel to a top surface of a substrate S (see FIG. 17) and may be perpendicular to each other.

Each display area DA may include a pixel area (PA) and a transmission area (TA). A plurality of pixels may be arranged along, e.g., the first direction and may be adjacent to each other in the pixel area PA. For example, each pixel area PA may include a red pixel Pr, a green pixel Pg and a blue pixel Pb.

Pixels Pr, Pg and Pb may have substantially the same dimension as illustrated in FIG. 16. However, the red pixel Pr, the green pixel Pg and the blue pixel Pb may have different dimensions from each other for improving a luminescent efficiency.

The transmission area TA may be adjacent to the red pixel Pr, the green pixel Pg and the blue pixel Pb in the display area DA. In some embodiments, the transmission area TA may be independently patterned per each pixel of the pixel area PA.

In some embodiments, the transmission area may extend in, e.g., the second direction D2, and may be provided commonly for the pixel areas PA included in a plurality of the display areas DA.

In example embodiments, the pixel circuit for implementing an image may be disposed in the pixel area PA. An external light may be transmitted at the transmission area TA so that an external image may be observed.

A transistor such as a thin film transistor (TFT) may be disposed in each pixel of the pixel area PA, and the transistor may be electrically connected to a data line DL and a gate line GL. As illustrated in FIG. 16, the data line DL and the gate line GL may cross each other, the each pixel may be defined at an intersection region of the data line DL and the gate line GL. The pixel circuit may include the data line DL, the gate line GL and the transistor.

The pixel circuit may further include a power line Vdd (not illustrated) that may be parallel to the data line DL. A capacitor electrically connected to the power line Vdd and the transistor may be provided in the each pixel.

One transistor is illustrated in the each pixel in FIG. 16, however, at least two transistors may be provided per each pixel. For example, a switching transistor and a driving transistor may be provided in the each pixel. The capacitor may be connected between the switching transistor and the driving transistor.

Referring to FIG. 17, the transistor may be disposed on a portion of a barrier layer 1100 formed on the substrate S at the pixel area PA. The transistor may include an active pattern 1200, a gate insulation layer 1300, a gate electrode 1350, a source electrode 1500 and a drain electrode 1550. A via insulation layer 1600 may cover the transistor, and a first electrode 1700 electrically connected to the drain electrode 1550 may be disposed on the via insulation layer 1600.

A transparent insulation substrate may be utilized as the substrate S. For example, the substrate S may include glass, or a polymeric material having transparent and flexible properties. If the substrate S includes the polymeric material, the transparent display device may be provided as a transparent flexible display device. For example, the substrate S may include polyimide, polysiloxane, an epoxy-based resin, an acryl-based resin, polyester, or the like. In an embodiment, the substrate S may include polyimide.

The barrier layer 1100 may be formed on a top surface of the substrate S. In some embodiments, the barrier layer 1100 may be commonly formed on the pixel area PA and the transmission area TA of the substrate S. Moisture and/or impurity diffusion through the substrate S, and between the substrate S and a structure thereon may be blocked by the barrier layer 1100.

For example, the barrier layer 1100 may include silicon oxide, silicon nitride or silicon oxynitride. These may be used alone or in a combination thereof. In some embodiments, the barrier layer 1100 may have a multi-layered structure including a silicon oxide layer and a silicon nitride layer.

The active pattern 1200 may be disposed on a portion of the barrier layer 1100 on the pixel area PA.

The active pattern 1200 may include a silicon compound such as polysilicon. In some embodiments, a source region and a drain region including p-type or n-type impurities may be formed at both ends of the active pattern 1200.

In some embodiments, the active pattern 120 may include an oxide semiconductor, e.g., indium gallium zinc oxide (IGZO), zinc tin oxide (ZTO), indium tin zinc oxide (ITZO), or the like.

The gate insulation layer 1300 may be formed on the barrier layer 1100, and may cover the active pattern 1200. In example embodiments, the gate insulation layer 1300 may include silicon oxide, silicon nitride and/or silicon oxynitride. In some embodiments, the gate insulation layer 1300 may have a multi-layered structure including a silicon oxide layer and a silicon nitride layer.

As illustrated in FIG. 3, the gate insulation layer 1300 may commonly extend on the pixel area PA and the transmission area TA similarly to the barrier layer 1100. In some embodiments, the gate insulation layer 1300 may be substantially selectively disposed on the pixel area PA.

The gate electrode 1350 may be disposed on the gate insulation layer 1300. The gate electrode 1350 may be substantially superimposed over the active pattern 1200 with respect to the gate insulation layer 1300.

The gate electrode 1350 may be electrically connected to the gate line GL. For example, as illustrated in FIG. 16, the gate electrode 1350 may be diverged from the scan line S.

The gate electrode 1350 may include and/or may be formed of a metal such as at least one of aluminum (Al), magnesium (Mg), silver (Ag), tungsten (W), copper (Cu), nickel (Ni), chromium (Cr), molybdenum (Mo), titanium (Ti), platinum (Pt), tantalum (Ta), neodymium (Nd) and scandium (Sc), an alloy thereof, or a nitride thereof. These may be used alone or in a combination thereof. The gate electrode 1350 may include at least two metal layers having different physical and chemical properties. For example, the gate electrode 1350 may have a double-layered structure such as an Al/Mo structure or a Ti/Cu structure.

An insulating interlayer 1400 may be formed on the gate insulation layer 1300, and may cover the gate electrode 1350. The insulating interlayer 1400 may include silicon oxide, silicon nitride and/or silicon oxynitride. These may be used alone or in a combination thereof. The insulating interlayer 1400 may have a multi-layered structure including a silicon oxide layer and a silicon nitride layer.

As illustrated in FIG. 17, the insulating interlayer 1400 may commonly extend on the pixel area PA and the transmission area TA similarly to the barrier layer 1100. In some embodiments, the insulating interlayer 1400 may be substantially selectively disposed on the pixel area PA.

The source electrode 1500 and the drain electrode 1550 may extend through the insulating interlayer 1400 and the gate insulation layer 1300 to be in contact with the active pattern 1200. The source electrode 1500 and the drain electrode 1550 may include and/or may be formed of a metal such as at least one of Al, Mg, Ag, W, Cu, Ni, Cr, Mo, Ti, Pt, Ta, Nd, or Sc, an alloy thereof, or a nitride thereof. These may be used alone or in a combination thereof. The source electrode 1500 and the drain electrode 1550 may include at least two different metal layers such as an Al layer and a Mo layer.

The source electrode 1500 and the drain electrode 1550 may be in contact with the source region and the drain region, respectively, of the active pattern 1200. A portion of the active pattern 1200 between the source region and the drain region may serve as a channel through which charges may be moved or transferred.

As illustrated in FIG. 16, the source electrode 1500 may be electrically connected to the data line DL. For example, the source electrode 1500 may be diverged from the data line DL.

The transistor may be defined by the active pattern 1200, the gate insulation layer 1300, the gate electrode 1350, the source electrode 1500 and the drain electrode 1550.

FIG. 17 illustrates that the transistor has a top gate structure in which the gate electrode 1350 overlies the active pattern 1200. However, the transistor may have a bottom gate structure in which the gate electrode 1350 is disposed under the active pattern 1200.

The via insulation layer 1600 may be formed on the insulating interlayer 1400, and may cover the source electrode 1500 and the drain electrode 1550. A via structure electrically connecting the first electrode 1700 and the drain electrode 1550 to each other may be accommodated in the via insulation layer 1600. The via insulation layer 1600 may have a substantially planar or leveled top surface, and may serve as a planarization layer of the transparent display device.

The via insulation layer 1600 may include an organic material, e.g., polyimide, an epoxy-based resin, an acryl-based resin, polyester, or the like. In example embodiments, the via insulation layer 1600 may commonly extend on the pixel area PA and the transmission area TA.

The first electrode 1700 may be disposed on the via insulation layer 1600, and may include the via structure extending through the via insulation layer 1600 to be in contact with or electrically connected to the drain electrode 1550. The first electrode 1700 may be selectively disposed on the pixel area PA, and may be individually provided per each pixel. The first electrode 1700 may serve as a pixel electrode or an anode.

In an embodiment, the first electrode 1700 may include a transparent conductive material having a high work function. For example, the first electrode 1700 may include indium tin oxide (ITO), indium zinc oxide (IZO), zinc oxide, or indium oxide. In this case, a transmittance of the transparent display device may be further improved.

In an embodiment, the first electrode 1700 may serve as a reflective electrode. In this case, the first electrode 1700 may include a metal, e.g., Al, Mg, Ag, W, Cu, Ni, Cr, Mo, Ti, Pt, Ta, Nd or Sc, or an alloy thereof.

In an embodiment, the first electrode 1700 may have a multi-layered structure including the transparent conductive material and the metal.

A back-plane (BP) structure of the transparent display device which may include the pixel circuit, the insulation layers and the first electrode 1700 may be defined.

The BP structure may further include a pixel defining layer (PDL) 1800. The PDL 1800 may be formed on the via insulation layer 1600, and may cover a peripheral portion of the first electrode 1700. The PDL 1800 may include a transparent organic material such as polyimide or an acryl-based resin.

The each pixel of the pixel area PA may be exposed by the PDL 1800. An area of the first electrode 170 which may not be covered by the PDL 1800 may be substantially equal to a light emitting area of the each pixel.

In example embodiments, the PDL 1800 may also extend on the transmission area TA.

The display layer 170 may be disposed on the PDL 1800 and the first electrode 1700. For example, the display layer 170 may be disposed on a sidewall of the PDL 1800 and a top surface of the first electrode 1700 exposed by the PDL 1800.

The display layer 170 may include an organic light emitting layer patterned individually for the red pixel Pr, the green pixel Pg and the blue pixel Pb to generate a different color at the each pixel. The organic light emitting layer may include a host material excited by holes and electrons, and a dopant material facilitating an emitting efficiency through absorbing and releasing energy.

In some embodiments, the display layer 170 may further include a hole transport layer (HTL) between the first electrode 1700 and the organic light emitting layer. The display layer 170 may further include an electron transport layer (ETL) on the organic light emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinazoline, or a combination thereof.

In some embodiments, at least one of the organic light emitting layers, the HTL and the ETL may not be individually patterned for the each pixel, and may be provided commonly for a plurality of pixels. In an embodiment, the organic light emitting layer may be provided for the plurality of the pixels, and a color of the each pixel may be achieved by a color filter. In this case, the transparent display device may serve as a white-OLED (W-OLED) device.

In some embodiments, the display layer 170 may include a liquid crystal layer instead of the organic light emitting layer. In this case, the transparent display device may be provided as a liquid crystal display (LCD) device.

A second electrode 2100 may be formed on the PDL 1800 and the display layer 170. The second electrode 2100 may face the first electrode 1700 with respect to the display layer 170.

In example embodiments, the second electrode 2100 may serve as a common electrode commonly provided for a plurality of the pixels. The second electrode 2100 may serve as a cathode of the transparent display device.

In example embodiments, the second electrode 2100 may include a metal having a low work function such as Ag, Mg, Al, W, Cu, Ni, Cr, Mo, Ti, Pt, Ta, Nd, Sc, or an alloy thereof. In some example embodiments, the second electrode may include an alloy of Ag and Mg (e.g., AgxMgl-x).

The second electrode 2100 may continuously extend on the pixel area PA and the transmission area TA. A thickness of the second electrode 2100 may be determined in consideration of a luminescent efficiency in the pixel area PA and a desired transmittance in the transmission area TA.

In some embodiments, the second electrode 2100 may be substantially removed from the transmission area TA.

A capping layer 2200 may be formed on the second electrode 2100. In example embodiments, the capping layer 2200 may cover a substantially entire top surface of the second electrode 2100, and may be provided commonly on the pixel area PA and the transmission area TA.

The capping layer 2200 may include an organic material having an improved transmissive property. In some embodiments, the capping layer 2200 may include a material substantially the same as or similar to the hole transport material. Thus, a light emitting property in the pixel area PA may not be disturbed by the second electrode 2100 serving as the cathode.

In some example embodiments, as illustrated in FIG. 17, the encapsulation substrate W may be further disposed over the capping layer 2200, and the filling layer 2400 may be further included between the capping layer 2200 and the encapsulation substrate W.

The encapsulation substrate W may include a glass substrate or a polymer substrate. The filling layer 2400 may include, e.g., a substantially transparent or transmissive organic material.

In some embodiments, an organic/inorganic complex layer may be utilized as a sealing film instead of the encapsulation substrate W and the filling layer 2400. In some embodiments, a thin film encapsulation (TFE) may be utilized as the sealing film.

The display panel driver may include a gate driver 300 and a data driver 400 to apply a driving signal to the transparent display panel 104.

In example embodiments, the gate driver 300 may be directly mounted on the peripheral region PA of the transparent display panel 104 in an ASG (amorphous silicon gate) type. In addition, the gate driver 300 may be disposed on the first surface 112 of the first substrate 110.

The data river 400 may be disposed on the second surface 114 of the first substrate 110. The data driver 400 may output the data voltages to the data lines DL through a first fanout wire FO1. The first fanout wire FO1 may be disposed on the first surface 112 of the first substrate 110, and the first fanout wire FO1 may make contact with the data lines DL.

The data driver 400 may include a data flexible substrate 410 and a data driving chip 420 mounted on the data. The data flexible substrate 410 may connect electrically the printed circuit board 200 with the transparent display panel 104. The data driving chip 420 may generate the driving signal.

In example embodiments, a plurality of data flexible substrates 410 may be provided. In addition, a plurality of data driving chips 420. Each of the data driving chips 420 may be mounted on a respective one of the data flexible substrates 410 in a COF (chip on film) type.

The first connection wire 500 may be disposed at a first side surface 116 connecting the first and second surfaces 112 and 114 of the first substrate 110. The first connection wire 500 may connect electrically the transparent display panel 104 with the data driver 400 through the first fanout wire FO1.

The second connection wire 600 may be disposed on the second surface 114 of the first substrate 110. The second connection wire 600 may connect electrically the transparent display panel 104 with the data driver 400 through the first connection wire 500 and the first fanout wire FO1.

According to example embodiments, the display panel driver may be connected (and/or attached) to the second surface 114 of the first substrate 110 of the transparent display panel 104, such that a size of the peripheral region PA of the transparent display panel 104 may be minimized. Therefore, a bezel for accommodating the peripheral region PA may have minimized width. The display apparatus may have a substantially narrow bezel. Advantageously, storage, utilization, arrangement, and/or combination involving the display apparatus may be facilitated.

Although example embodiments have been described, those skilled in the art will readily appreciate that many modifications are possible in the example embodiments. All such modifications are intended to be included within the scope defined in the claims.

What is claimed is:

1. A display apparatus comprising:
   a display panel including a substrate and a display layer disposed on a first surface of the substrate;
   a display panel driver configured to apply a driving signal to the display panel, disposed on a second surface of the substrate opposite the first surface of the substrate, and completely overlapped by the substrate;
   a controller positioned between the display panel driver and the second surface of the substrate and configured to provide a control signal to the display panel driver, wherein the substrate is positioned between the controller and the display layer, and wherein the second surface of the substrate is positioned between the controller and the first surface of the substrate; and
   a first connection wire disposed at a first side surface of the substrate, the first side surface of the substrate connecting the first surface of the substrate and the second surface of the substrate and being smaller than each of the first surface of the substrate and the second surface of the substrate, the first connection wire electrically connecting the display panel with the display panel driver,
   wherein the display panel driver is positioned between two opposite edges of the controller.

2. The display apparatus of claim 1, further comprising:
   a second connection wire disposed on the second surface adjacent to the first side surface of the substrate, the second connection wire electrically connecting the display panel driver with the first connection wire.

3. The display apparatus of claim 2, further comprising:
   a third connection wire disposed at a second side surface connecting the first and second surfaces adjacent to the first side surface of the substrate, the third connection wire electrically connecting the display panel with the display panel driver.

4. The display apparatus of claim 3, further comprising:
   a fourth connection wire disposed on the second surface adjacent to the second side surface of the substrate, the fourth connection wire electrically connecting the display panel driver with the third connection wire.

5. The display apparatus of claim 3, wherein the display panel driver includes a data driver and a gate driver,
   wherein the first connection wire electrically connects the data driver with the display panel, and
   wherein the third connection wire electrically connects the gate driver with the display panel.

6. The display apparatus of claim 1, wherein a width of the first connection wire is within a range of about 5 μm to about 40 μm.

7. The display apparatus of claim 1,
   wherein the display panel driver generates the driving signal based on the control signal, and the display panel driver electrically connects the display panel with the controller.

8. The display apparatus of claim 7, wherein the display panel driver includes:
   a flexible substrate connecting the controller with the display panel; and a driving chip mounted on the flexible substrate, the driving chip configured to generate the driving signal.

9. The display apparatus of claim 7, wherein the controller includes a printed circuit board.

10. The display apparatus of claim 1, wherein the display layer includes a liquid crystal layer or an organic light emitting layer.

11. The display apparatus of claim 1, wherein the display panel includes a pixel area and a transmission area, and
wherein the display panel includes a transparent display panel.

12. A tiled display apparatus comprising:
a plurality of display panels connected to one another, each of the display panels including a substrate and a display layer disposed on a first surface of the substrate, the display layer provided on a pixel electrode;
a plurality of display panel drivers configured to apply driving signals to the display panels respectively, each of the display panel drivers disposed on a second surface of the substrate opposite the first surface of the substrate and completely overlapped by the substrate; and
a controller disposed on the second surface of the substrate, partially overlapping each of the display panel drivers, and configured to provide a control signal to at least of the display panel drivers;
a plurality of first connection wires electrically connecting the display panels with the display panel drivers respectively, each of the first connection wires disposed at a first side surface of the substrate, the first side surface of the substrate connecting the first surface of the substrate and the second surface of the substrate.

13. The display apparatus of claim 12, further comprising:
a plurality of second connection wires electrically connecting the display panel drivers with the first connection wires respectively, each of the second connection wires disposed at the second surface adjacent to the first side surface of the substrate.

14. The display apparatus of claim 12, wherein each of the display panels includes a pixel area and a transmission area, and
wherein each of the display panels includes a transparent display panel.

15. A display apparatus comprising:
a substrate, which comprises a first side, a second side, and a third side, wherein the first side is opposite the second side and is not coplanar with either of the second side and the third side, and wherein the second side is connected through the third side to the first side and is not coplanar with the third side;
a first pixel electrode;
a first driver completely overlapped by the substrate;
a first switching element, which is electrically connected to each of the first pixel electrode and the first driver, wherein both the first side and the second side are positioned between the first driver and at least one of the first pixel electrode and the first switching element;
a controller overlapping the substrate and configured to provide a control signal to the first driver, wherein a portion of the first driver is positioned between the controller and the third side of the substrate; and
a first wire, which overlaps the third side and extends not parallel to either of the first side and the second side, wherein the first driver is electrically connected through the first wire to the first switching element.

16. The display apparatus of claim 15, wherein the first side and the second side are both positioned between the first driver and the first pixel electrode and are both positioned between the first driver and the first switching element.

17. The display apparatus of claim 16, wherein the first wire extends perpendicular to at least one of the first side and the second side.

18. The display apparatus of claim 16 comprising:
a second wire, wherein the first driver is electrically connected through the second wire to the first wire, and wherein the first side and the second side are both positioned between the second wire and at least one of the first switching element and the first pixel electrode, and
a third wire, wherein the first wire is electrically connected through the third wire to the first switching element, and wherein the first side and the second side are both positioned between the second wire and the third wire.

19. The display apparatus of claim 18 comprising:
a fourth wire; and
a second driver, which is electrically connected through the fourth wire to the first switching element,
wherein the substrate comprises a fourth side, which overlaps the fourth wire and is not coplanar with any of the first side, the second side, and the third side, and
wherein the first side is connected through the fourth side to the second side.

* * * * *